US 8,956,902 B2

(12) United States Patent
Tsuji

(10) Patent No.: US 8,956,902 B2
(45) Date of Patent: Feb. 17, 2015

(54) PROCESS FOR MANUFACTURING BURIED HETERO-STRUCTURE LASER DIODES

(75) Inventor: Yukihiro Tsuji, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/544,000

(22) Filed: Jul. 9, 2012

(65) Prior Publication Data

US 2013/0017638 A1  Jan. 17, 2013

(30) Foreign Application Priority Data

Jul. 14, 2011  (JP) .................................. 2011-155991

(51) Int. Cl.
*H01L 21/00* (2006.01)
*H01S 5/20* (2006.01)
*H01S 5/227* (2006.01)
H01S 5/024 (2006.01)
H01S 5/042 (2006.01)
(Continued)

(52) U.S. Cl.
CPC ............. *H01S 5/2086* (2013.01); *H01S 5/2275* (2013.01); *H01S 5/02476* (2013.01); *H01S 5/0425* (2013.01); *H01S 5/2201* (2013.01); *H01S 5/3401* (2013.01); *H01S 5/2224* (2013.01); *H01S 2301/176* (2013.01); *H01S 2304/04* (2013.01)
USPC .......................................................... 438/40

(58) Field of Classification Search
CPC ... H01S 5/0425; H01S 5/2086; H01S 5/2224; H01S 5/2275; H01S 5/3401; H01S 2301/176; H01S 2304/04; H01S 5/2201

USPC ............ 372/39, 43.01, 44.01, 46.01; 438/40, 438/38, 39, 22, 41, 42, 43, 44, 47
See application file for complete search history.

(56) References Cited

U.S. PATENT DOCUMENTS 4,007,104 A * 2/1977 Summers et al. .............. 438/713
5,153,147 A * 10/1992 Karlicek, Jr. .................... 117/89
(Continued)

FOREIGN PATENT DOCUMENTS

JP     08250806 A  *  9/1996

OTHER PUBLICATIONS

Crystal Planes in Semiconductors, Department of Electrical and Computer Engineering, Brigham Young University.*

*Primary Examiner* — Bac Au
*Assistant Examiner* — Sophia Nguyen
(74) *Attorney, Agent, or Firm* — Smith, Gambrell & Russell LLP

(57) ABSTRACT

A process for manufacturing buried hetero-structure laser diodes includes the steps of forming a stacked semiconductor layer on a substrate; forming a mask layer on the stacked semiconductor layer; forming a semiconductor mesa by etching the stacked semiconductor layer through the mask layer; forming an overhang of the mask layer by selectively etching the stacked semiconductor layer of the semiconductor mesa; selectively growing a buried layer on a side surface of the semiconductor mesa while leaving the mask layer on the semiconductor mesa; forming a lateral portion of the buried layer, the lateral portion having a side surface adjacent to the side surface of the semiconductor mesa; after forming the lateral portion of the buried layer, removing the mask layer on the semiconductor mesa; and forming an electrode on a top surface of the semiconductor mesa and on the side surface of the lateral portion of the buried layer.

5 Claims, 19 Drawing Sheets

(51) Int. Cl.
*H01S 5/22* (2006.01)
*H01S 5/34* (2006.01)

(56) References Cited

U.S. PATENT DOCUMENTS

| | | | |
|---|---|---|---|
| 5,585,309 A * | 12/1996 | Mori et al. | 438/43 |
| 5,689,358 A * | 11/1997 | Nakao et al. | 359/248 |
| 6,030,452 A * | 2/2000 | Takeuchi | 117/104 |
| 6,498,076 B1 * | 12/2002 | Koui | 438/479 |
| 6,556,605 B1 * | 4/2003 | Shtengel et al. | 372/46.01 |
| 6,775,309 B2 * | 8/2004 | Fang | 372/43.01 |
| 7,271,019 B1 * | 9/2007 | Pham et al. | 438/22 |
| 8,039,282 B2 * | 10/2011 | Yoshimura et al. | 438/39 |
| 2002/0093013 A1 * | 7/2002 | Charles | 257/27 |
| 2004/0126912 A1 * | 7/2004 | Beck et al. | 438/22 |
| 2004/0213313 A1 * | 10/2004 | Akulova et al. | 372/46 |
| 2006/0030065 A1 * | 2/2006 | Kondo et al. | 438/57 |
| 2006/0177953 A1 * | 8/2006 | Takeuchi | 438/29 |
| 2008/0219312 A1 * | 9/2008 | Sugiyama et al. | 372/46.01 |
| 2009/0243013 A1 * | 10/2009 | Nakaji et al. | 257/432 |
| 2009/0252190 A1 * | 10/2009 | Yoshimura et al. | 372/45.01 |
| 2010/0142026 A1 * | 6/2010 | Kato | 359/248 |
| 2010/0189154 A1 * | 7/2010 | Makino et al. | 372/50.11 |
| 2013/0010824 A1 * | 1/2013 | Okumura et al. | 372/45.01 |

* cited by examiner

PROCESS FOR MANUFACTURING BURIED HETERO-STRUCTURE LASER DIODES

BACKGROUND OF THE INVENTION

1. Field of the Invention

The present invention relates to a process for manufacturing buried hetero-structure (BH) laser diodes (LD).

2. Description, of the Related Art

Patent Literature 1 (US Application Publication No. 2008/0219312) discloses a quantum cascade laser (QCL) device having a buried hetero-structure. The quantum cascade laser device described in the patent literature 1 has a stripe-shaped mesa structure extending along a predetermined direction of a principal surface of a substrate. Further; the cross-section of the mesa structure in a direction perpendicular to the predetermined direction has a rectangle shape or an inverted mesa shape. With such a configuration, the quantum cascade laser device has high slope efficiency and operates with a stable single transverse mode.

In general, a process for the manufacturing of a buried hetero-structure laser diode (BH LD) includes a step of growing a stacked semiconductor layer including an active layer onto a semiconductor substrate and a step of forming a semiconductor mesa. In addition, the step of the semiconductor mesa includes the steps of forming a stripe-shaped mask extending in a predetermined direction on the stacked semiconductor layer and etching the stacked semiconductor layer through the mask. The mask is made of, for example, SiN or $SiO_2$. Such a production process further includes a step of forming a buried layer on a side surface of the semiconductor mesa while using the mask as a selective growth mask and a step of forming an upper electrode on the semiconductor mesa and forming a lower electrode on the back surface of the semiconductor substrate.

SUMMARY OF THE INVENTION

When the buried layer is grown on the side surface of the semiconductor mesa, a portion abnormally grown with a large step that is so-called "abnormal growth" occurs in the vicinity of the side surface of the semiconductor mesa. In order to suppress the abnormal growth of a buried layer in the step of forming the buried layer, the semiconductor mesa has an overhang of the mask which is formed by undercutting the stacked semiconductor layer relative to the mask in the step of etching the stacked semiconductor layer. When a semiconductor material is grown on the side surface of the semiconductor mesa while using the mask as a selective growth mask, the growth rate in a region in the vicinity of the side surface of the semiconductor mesa is lower than the growth rate in a region distant from the side surface of the semiconductor mesa (that is, a region on the semiconductor substrate). In this manner, the abnormal growth of the buried layer in the vicinity of the side surface of the semiconductor mesa is suppressed. A buried layer is grown on the side surface of the semiconductor mesa as well as on the semiconductor substrate. As a result, a buried layer is formed with approximately the same thickness as the height of the semiconductor mesa in the entire region which has been created by etching of the stacked semiconductor layer. Thereafter, an upper electrode is formed on the semiconductor mesa and the buried layer.

Buried hetero-structure laser diodes (BH LDs) obtained by such conventional production processes have a problem in that the heat dissipation properties of the buried hetero-structure laser diodes are low.

In general, heat that has been generated in an active layer of a LD during laser oscillation is mainly-dissipated through electrodes. The electrode is formed of a metal material with higher thermal conductivity than that of semiconductor materials. However, according to a conventional BH LD manufacturing process such as that described above, a buried layer is formed with approximately the same thickness as the height of a semiconductor mesa in the entire-region which has been created by etching of a stacked semiconductor layer. Accordingly, it is difficult to extend an upper electrode to a region an a side surface of the semiconductor mesa. Thus, while heat generated in an active layer during laser oscillation is dissipated through the upper electrode and the lower electrode provided on and under the semiconductor mesa, heat is hardly dissipated in a direction toward the side surface of the semiconductor mesa. Low heat dissipation properties are ascribed to such a structural problem. In particular, a quantum cascade laser (QCL) requires a relatively large injection current of about 0.5 A to 1 A, thus resulting in a large amount of heat generated in the active layer. Accordingly, an improvement in terms of the dissipation of heat generated in an active layer is particularly important with quantum-well cascade lasers (QCLs).

A possible approach for solving such a problem is to form a stripe-shaped mask on a semiconductor mesa with a greater width than the semiconductor mesa and form a trench by etching a buried layer after the step of forming the buried layer on the side surface of the semiconductor mesa. In this manner, the buried layer can be etched except in the vicinity of the side surface of the semiconductor mesa so as to form a side surface of the buried layer (a side surface of the trench) that is parallel to the side surface of the semiconductor mesa. Then, an upper electrode is formed on the side surface of the trench that is formed adjacent to the side surface of the semiconductor mesa. In this structure, heat generated in an active layer is dissipated in a direction toward the side surface of the semiconductor mesa as well.

When a stripe-shaped mask is formed on a semiconductor mesa with a greater width than the semiconductor mesa, however, a certain extent of misalignment occurs between the mask and the semiconductor mesa. Consequently, a certain amount of difference is caused between a desired thickness and the thickness of a buried layer remaining in the vicinity of the side surface of the semiconductor mesa after etching of the buried layer. Thus, heat dissipation properties in a direction toward a side surface of a semiconductor mesa cannot be sufficiently improved due to the thickness of such a residual buried layer being excessively large. If the thickness of such a residual buried layer becomes excessively small, the breakdown voltage of laser diode decreases. Thus, it has been difficult to improve heat dissipation properties while suppressing the deterioration of laser characteristics in terms of breakdown voltage.

A process for manufacturing buried hetero-structure laser diodes according tope Present invention includes the steps of forming a stacked semiconductor layer including an active layer on a principal surface of a substrate; forming a stripe-shaped mask layer on the stacked semiconductor layer, the mask layer extending along a first direction; forming a semiconductor mesa extending along the first direction by etching the stacked semiconductor layer through the mask layer; forming an overhang of the mask layer by selectively etching the stacked semiconductor layer of the semiconductor mesa; selectively growing a buried layer on a side surface of the semiconductor mesa while leaving the mask layer with the overhang on the semiconductor mesa; forming a lateral portion of the buried layer, the lateral portion having a side surface adjacent to the side surface of the semiconductor mesa in a second direction perpendicular to the first direction; after forming the lateral portion of the buried layer, removing the mask layer on the semiconductor mesa; and forming an electrode on a top surface of the semiconductor mesa and on the side surface of the lateral portion of the buried layer.

According to the process for manufacturing buried hetero-structure laser diodes, in the step of forming the electrode, the electrode is formed on the top surface of the semiconductor mesa and on the side surface of the lateral portion of the buried layer. As a result, part of the electrode becomes adjacent to the side surface of the semiconductor mesa in the second direction with the lateral portion of the buried layer interposed therebetween. With this configuration, heat that has been generated in the active layer of the semiconductor mesa can be easily dissipated in a direction toward the side surface of the semiconductor mesa as well. Thus, the heat dissipation properties of laser diodes are improved. Furthermore, the step of selectively growing the buried layer and the step of forming the lateral portion of the buried layer are successively performed while leaving the mask layer on the semiconductor mesa. After forming the lateral portion of the buried layer, the mask layer on the semiconductor mesa is removed. Therefore, the mask layer is formed on the semiconductor mesa under the process from the step of forming a semiconductor mesa to the step of forming a lateral portion Of the buried layer, and another mask layer is not formed on, the semiconductor mesa so as to form the lateral portion of the buried layer. Unlike a case in which a new mask layer is formed on the semiconductor mesa with a greater width than the semiconductor mesa so as to form a trench, the process according to the present invention is free from the risk that the semiconductor mesa and the mask layer are misaligned relative to each other. Thus, the thickness of the lateral portion of the buried layer can be controlled accurately. According to the above configuration, the thickness of the lateral portion of the buried layer can be prevented from becoming smaller than a desired thickness, and as a result breakdown voltage properties are maintained at a sufficient level.

In the process for manufacturing buried hetero-structure laser diodes according to the invention, in the step of growing a buried layer, the buried layer is preferably grown on the side surface of the semiconductor mesa and on the substrate. In addition, in the step of forming the lateral portion of the buried layer, the lateral portion is preferably formed by etching the buried layer using the stripe-shaped mask layer on the semiconductor mesa.

In this manner, the buried layer that has the lateral portion adjacent to the side surface of the semiconductor mesa can be formed easily.

In the process for manufacturing buried hetero-structure laser diodes according to the invention, in the step of growing the buried layer, the buried layer preferably covers part of the side surface of the semiconductor mesa. In addition, the step of forming the lateral portion of the buried layer preferably includes a step of covering the entire side surface of the semiconductor mesa by heat treatment which brings about migration of a material constituting the buried layer onto the remaining part of the side surface of the semiconductor mesa.

In this manner, the step of etching the buried layer can be omitted so as to form the lateral portion of the buried layer. Thus, the production steps are simplified and the buried layer can be prevented from damages caused by etching of the buried layer.

In the process for manufacturing buried hetero-structure laser diodes according to the invention, the heat treatment is preferably carried out in a phosphorus atmosphere at a temperature that is not less than 650° C. and not more than 700° C.

In the process for manufacturing buried hetero-structure laser diodes according to the invention, it is preferable that the principal surface of the substrate be a (100) plane, that the first direction be a [011] direction. In addition, in the Step of growing the buried layer, the buried layer preferably covers the side surface of the semiconductor mesa and the substrate. Furthermore, the step of forming the lateral portion of the buried layer preferably includes a heat treatment step in which a material constituting the buried layer migrates, the side surface Of the lateral portion of the buried layer having a (0-11) plane.

According to the above configuration, the at least a section of the lateral portion of the buried layer after the heat treatment extends along a direction perpendicular to the principal surface of the semiconductor substrate. As a result, the electrode can be formed easily on the top surface of the semiconductor mesa and on the side surface of the lateral portion of the buried layer.

In the process for manufacturing buried hetero-structure laser diodes according to the invention, it is preferable that the process further include a step of forming a passivation film on the top surface of the semiconductor mesa and the side surface of the lateral portion of the buried layer, and a step of forming an opening on the top surface of the semiconductor mesa. In addition, in the step of forming the electrode, the electrode is preferably formed in the opening and on the passivation film formed on the side surface of the lateral portion of the buried layer. With this configuration, the breakdown voltage properties of buried hetero-structure laser diodes can be further enhanced.

In the process for manufacturing buried hetero-structure laser diodes according to the invention, the side surface of the lateral portion of the buried layer preferably has a surface that extends along a direction perpendicular to the principal surface of the semiconductor substrate. In addition, in the step of forming the opening on the top surface of the semiconductor mesa, the passivation film is preferably etched by a dry etching without forming a mask on the passivation film formed on the side surface of the lateral portion of the buried layer, the passivation film on the side surface of the lateral portion of the buried layer remaining.

In this manner, the passivation film remains on the at least a section of the lateral portion of the buried layer, and as a result the breakdown voltage properties of buried hetero-structure laser diodes are sufficiently enhanced. Furthermore, in the step of forming the opening on the top surface of the semiconductor mesa, a step of forming a mask covering the passivation film formed on the side surface of the lateral portion of the buried layer can be omitted. Thus, the production steps are simplified. In addition, after the passivation film is formed on the top surface of the semiconductor mesa, and the exposed surface of the buried layer, the passivation film is etched by a dry etching process except the portion on the at least a section of the lateral portion of the buried layer. With the resultant configuration, heat generated in the active layer during laser oscillation is prevented from being hardly dissipated by the presence of the passivation film.

In the process for manufacturing buried hetero-structure laser diodes according to the invention, the buried layer may be made of Fe-doped InP. In addition, the active layer of the stacked semiconductor layer preferably includes a quantum cascade structure having a plurality of light emitting layers and a plurality of injection layers alternately stacked on top of one another.

DESCRIPTION OF THE PREFERRED EMBODIMENTS

Figure 1:
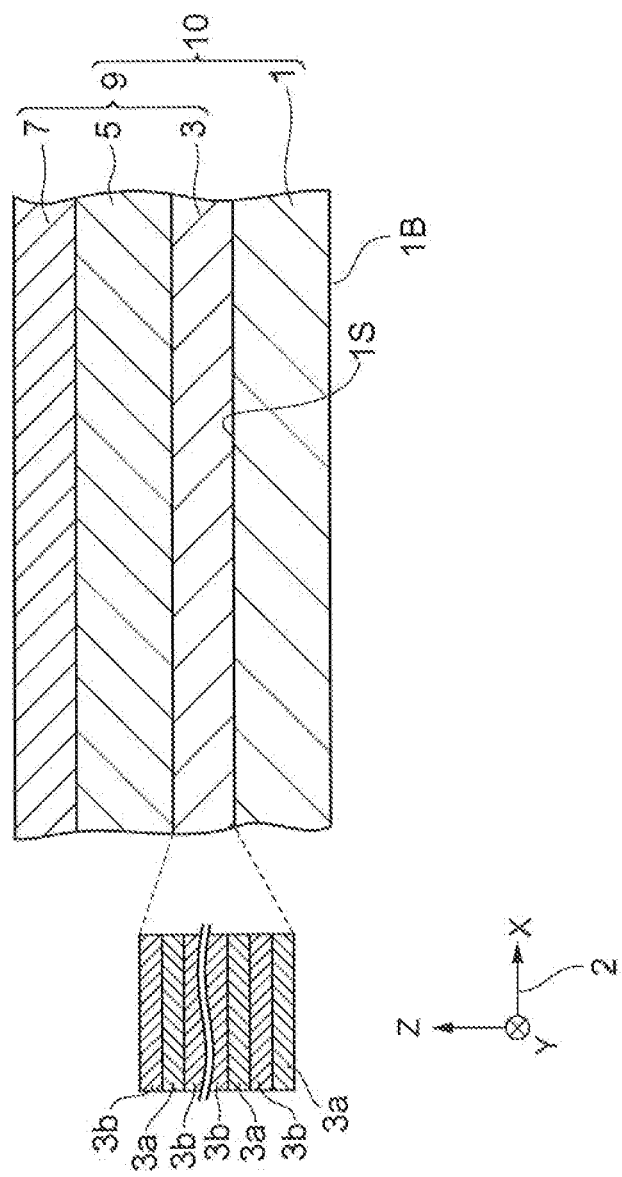
FIG. 1 is a cross sectional view for explaining a process for manufacturing buried hetero-structure laser diodes according to a first embodiment.

Hereinbelow, embodiments of the processes for manufacturing buried, hetero-structure laser diodes and embodiments of the buried hetero-structure laser diodes according to the invention will be described in detail with reference to the appended drawings. In the drawings, identical elements are assigned with an identical reference sign when possible. Further, the dimensional ratio in a structural component and the dimensional ratio among structural components have been appropriately modified for easy viewing of the drawings.

First Embodiment

Figure 2:
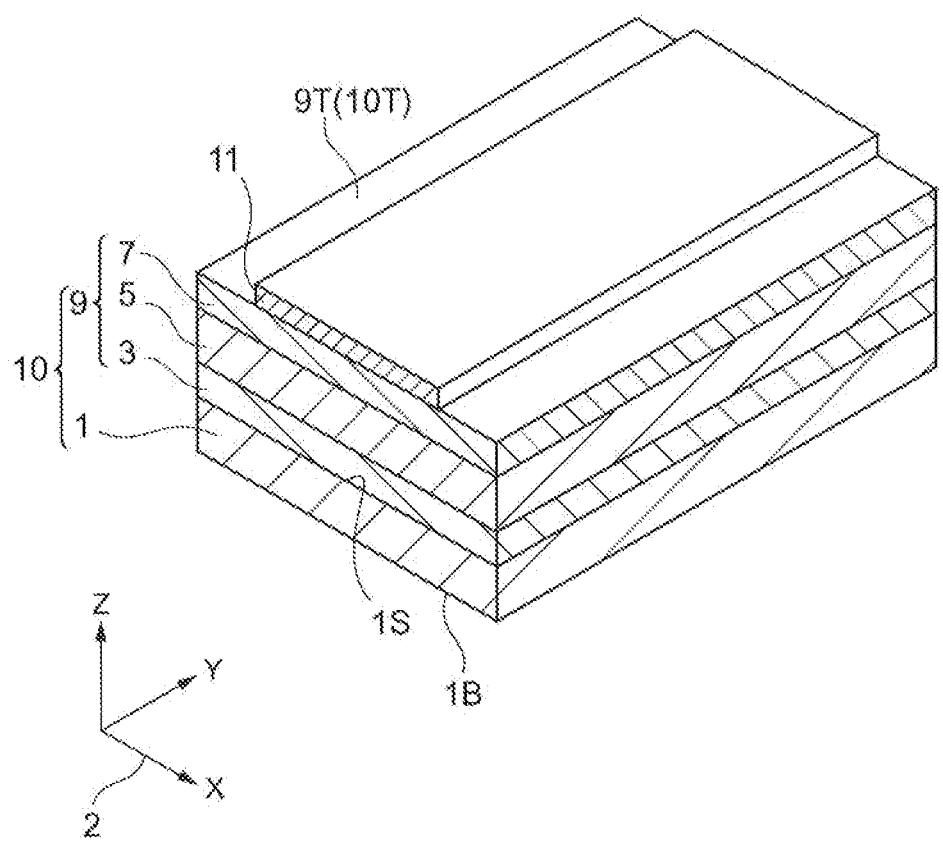
FIG. 2 is a cross sectional perspective view for explaining a process for manufacturing buried hetero-structure laser diodes according to the first embodiment.
Figure 6:
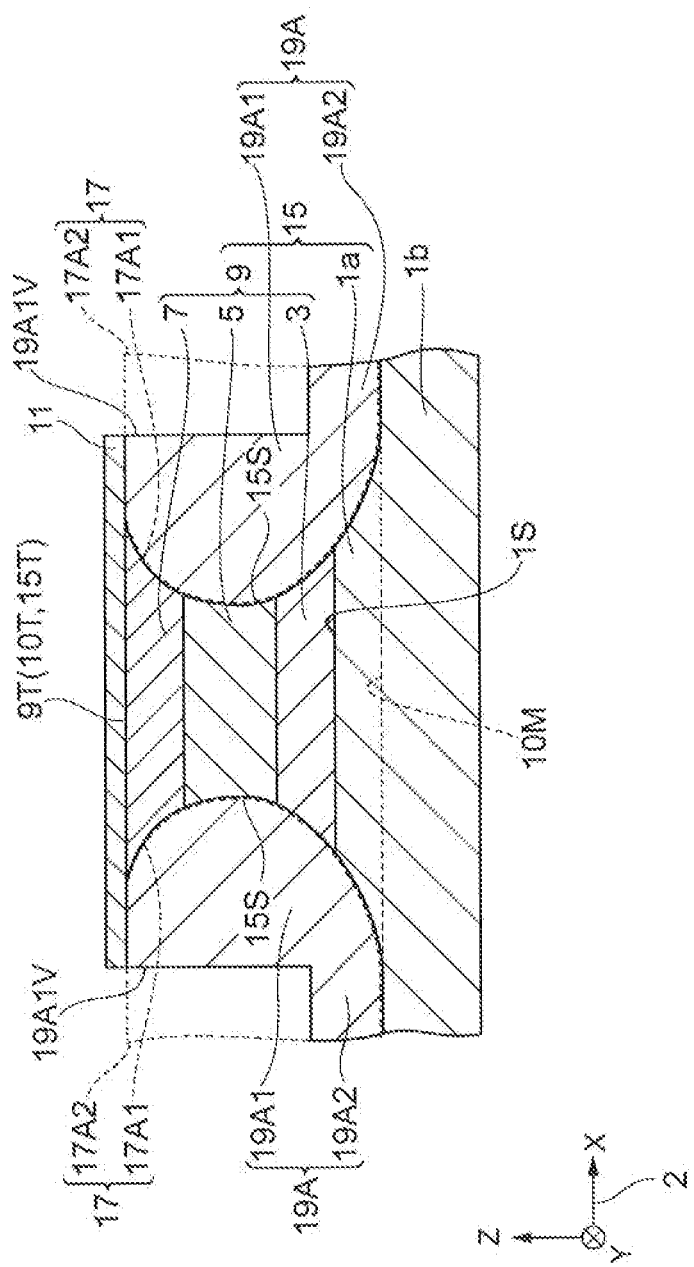
FIG. 6 is a cross sectional view for explaining a process for manufacturing buried hetero-structure laser diodes according to the first embodiment.
Figure 7:
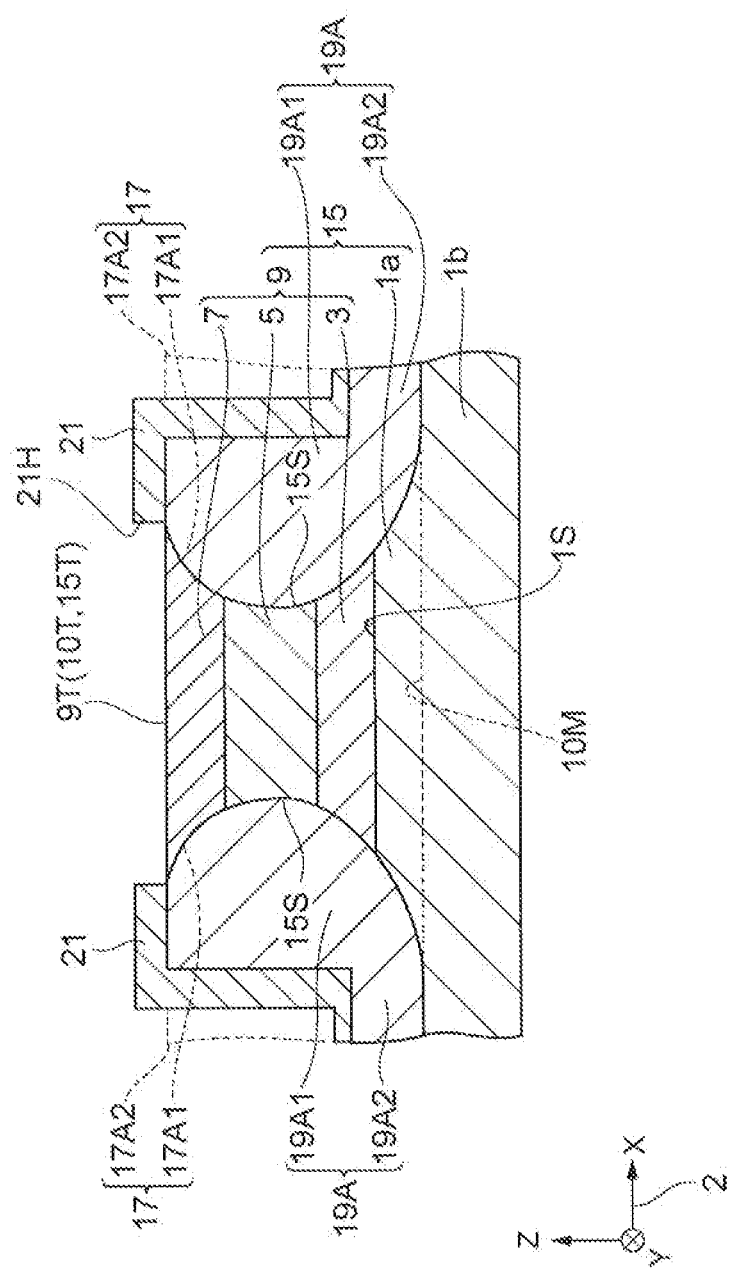
FIG. 7 is a cross sectional view for explaining a process for manufacturing, buried hetero-structure laser diodes according to the first embodiment.
Figure 8:
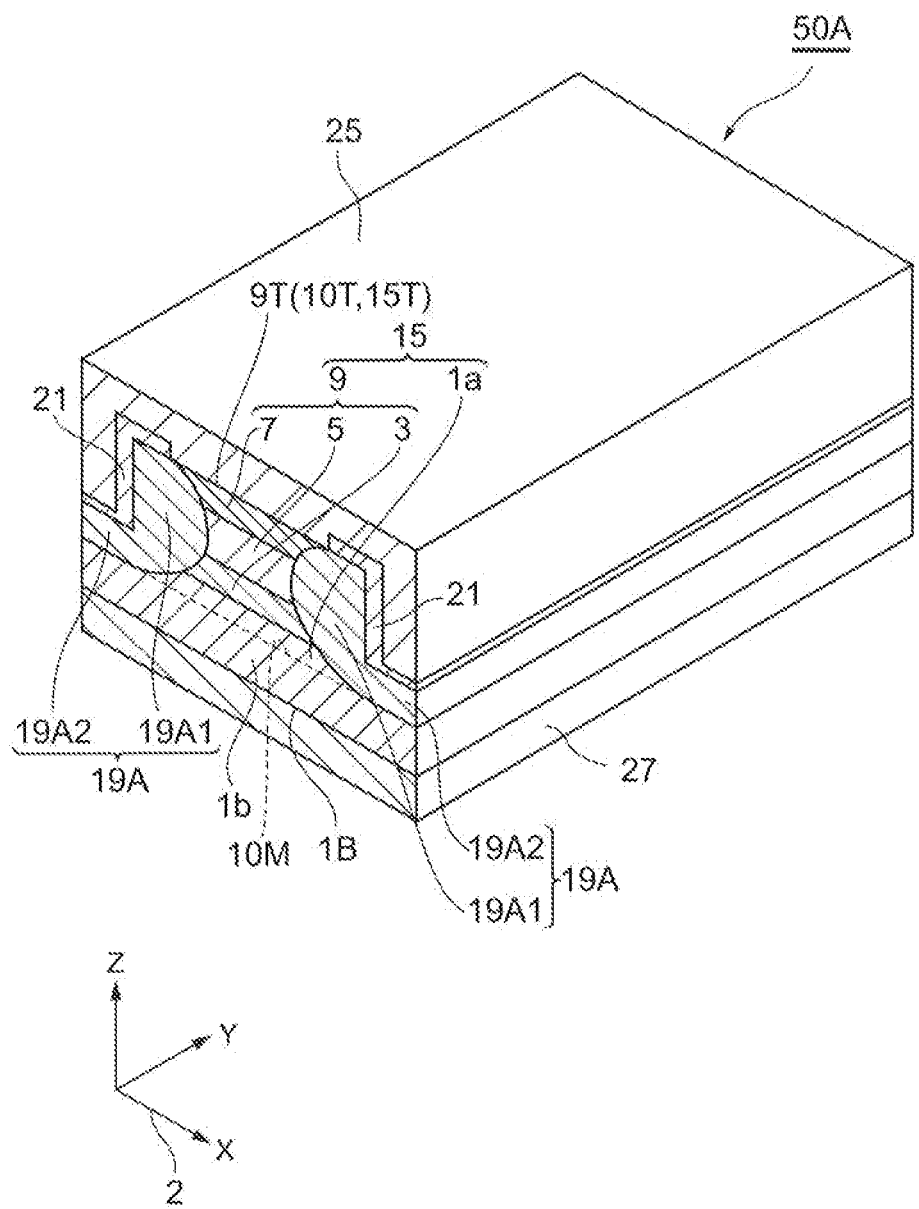
FIG. 8 is a perspective view for explaining a process for manufacturing buried hetero-structure laser diodes according to the first embodiment.

FIGS. 1 and 3 to 7 are cross sectional views for explaining a process for manufacturing buried hetero-structure laser diodes according to a first embodiment. FIG. 2 is a cross sectional perspective view for explaining a process for manufacturing buried hetero-structure laser diodes according to the first embodiment. FIG. 8 is a perspective view for explaining a process for manufacturing buried hetero-structure laser diodes according to the first embodiment.

The process for manufacturing buried hetero-structure laser diodes according to this embodiment mainly includes a stacked semiconductor layer forming step, a mask layer forming step, a semiconductor structure etching step, a buried layer forming step, a passivation film forming step and an electrode forming step.

(Stacked Semiconductor Layer Forming Step)

First, a stacked semiconductor layer forming step is carried out. In this step; as illustrated in FIG. 1, a stacked semiconductor layer 9 including an, active layer 3 is formed on a principal surface 1S of a semiconductor substrate 1. In detail, the active layer 3, an upper cladding layer 5 and a contact layer 7 are grown in this order on the principal surface 1S of the semiconductor substrate 1 by an epitaxial growth method such as a molecular beam epitaxy (MBE) method or a metal-organic vapor phase epitaxy (MOVPE) method. Thus, a semiconductor structure 10 including the semiconductor substrate 1 and the stacked semiconductor layer 9 is formed.

In this embodiment, the semiconductor substrate 1 is formed of an n-type semiconductor material. For example, the semiconductor substrate 1 may be formed of a III-V group compound semiconductor, for example InP, doped with an n-type impurity such as tin (Sn). The semiconductor substrate 1 has a principal surface 1S and a back surface 1B which are substantially flat. In FIG. 1, an orthogonal coordinate system 2 is illustrated. In detail, directions that are parallel to the principal surface 1S of the semiconductor substrate 1 are on the X-axis and the Y-axis, and the thickness direction of the semiconductor substrate 1 is on the Z-axis. An orthogonal coordination system 2 is also indicated in FIG. 2 and later figures so as to correspond to the orthogonal coordination system in FIG. 1.

In this embodiment, the stacked semiconductor layer 9 has a structure for forming a quantum cascade laser (QCL). In detail, the active layer 3 in the stacked semiconductor layer 9 has a quantum cascade structure in which a plurality of light emitting layers 3a and a plurality of injection layers 3b are alternately stacked on top of one another. The light emitting layer 3a is formed of, for example, InGaAs and the injection layer 3b is formed of, for example, AlInAs. The thickness of each of the light emitting layer 3a and the injection layer 3b may be, for example, not less than 1.5 μm and not more than 2.0 μm. The stacked semiconductor layer 9 may be designed so as to have an emission wavelength in the mid-infrared wavelength region (a 2 μm to 10 μm wavelength band) by appropriately controlling the compositions and the thicknesses of the light emitting layers 3a and the injection layers 3b forming the quantum cascade structure.

In this embodiment, the upper cladding layer 5 is formed of an n-type semiconductor material. For example, the upper cladding layer 5 may be formed of a III-V group compound semiconductor; for example InP, doped with an n-type impurity such as silicon (Si). The thickness of the upper cladding layer 5 is, for example, 3 μm.

In this embodiment, the contact layer 7 is formed of an n-type semiconductor material. For example, the contact layer 7 may be formed of a III-V group compound semiconductor, for example InGaAs, doped with an n-type impurity such as silicon (Si). The thickness of the contact layer 7 is, for example, 100 nm.

In this embodiment, the semiconductor substrate 1 functions as a lower cladding layer for the active layer 3. However, the stacked semiconductor layer 9 may further have a lower cladding layer between the semiconductor substrate 1 and the active layer 3.

(Mask Layer Forming Step)

Next, a mask layer forming step is carried out. In this step, as illustrated in FIG. 2, a stripe-shaped mask layer 11 is formed on a top surface 9T of the stacked semiconductor layer 9 (a top surface 10T of the semiconductor structure 10). The mask layer 11 extends along a first direction that is parallel to the principal surface 1S of the semiconductor substrate 1. In FIG. 2, the first direction is on the Y-axis of an orthogonal coordination system 2. The mask layer 11 is composed of an insulating layer. Specifically, the mask layer 11 is made of a dielectric film such as silicon dioxide ($SiO_2$) film or silicon nitride (SiN) film. The thickness of the mask layer 11 is, for example, 300 nm. The width of the mask layer 11 in a second direction that is parallel to the principal surface 1S of the semiconductor substrate 1 and is perpendicular to the first direction is, for example, not less than 5 μm and not more than 20 μm.

For example, the mask layer 11 may be produced by forming an insulating layer on the entirety of the top surface of the stacked semiconductor layer 9 and patterning the insulating layer by a photolithographic method. The insulating layer may be formed by, for example, plasma-enhanced chemical vapor deposition (PECVD).

(Semiconductor Structure Etching Step)

Next, a semiconductor structure etching step is carried out. In this step, the semiconductor structure 10 is etched through the mask layer 11 to the midpoint of the semiconductor structure 10 in the thickness direction (the X-axis direction). By this etching, a semiconductor mesa is formed.

Figure 3:
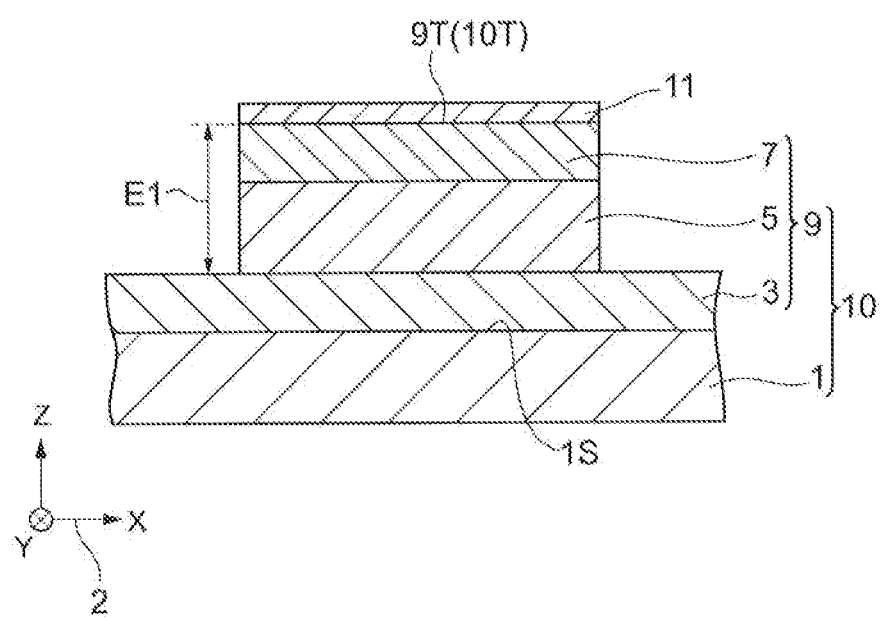
FIG. 3 is across sectional view for explaining a process for manufacturing buried hetero-structure laser diodes according to the first embodiment.

In this embodiment, as illustrated in FIG. 3, part of the stacked semiconductor layer 9 is etched by a dry etching process using the mask layer 11 as a mask. In this embodiment, the layers in the Stacked semiconductor layer 9 that are above the active layer 3, namely, the contact layer 7 and the upper cladding layer 5 are etched. Etching this part of the stacked semiconductor layer 9 results in a mesa shape corresponding to the shape of the mask layer 11. Due to the use of a dry etching process, the mesa structure has a shape which extends along the Y-axis direction and in which the width in the X-axis direction is substantially equal to the width of the mask layer 11 in the X-axis direction. The mesa structure formed by a dry etching process has a substantially vertical side surface. The etching depth E1 in the etched part of the stacked semiconductor layer 9 is, for example, 3 μm.

An exemplary dry etching process is inductive coupled plasma reactive ion etching (TCP-RIE) using a gas mixture of methane gas ($CH_4$) and hydrogen gas ($H_2$), hydrogen chloride (HCl), silicon tetrachloride ($SiCl_4$) or hydrogen iodide (HI) as an etching gas.

Figure 4:
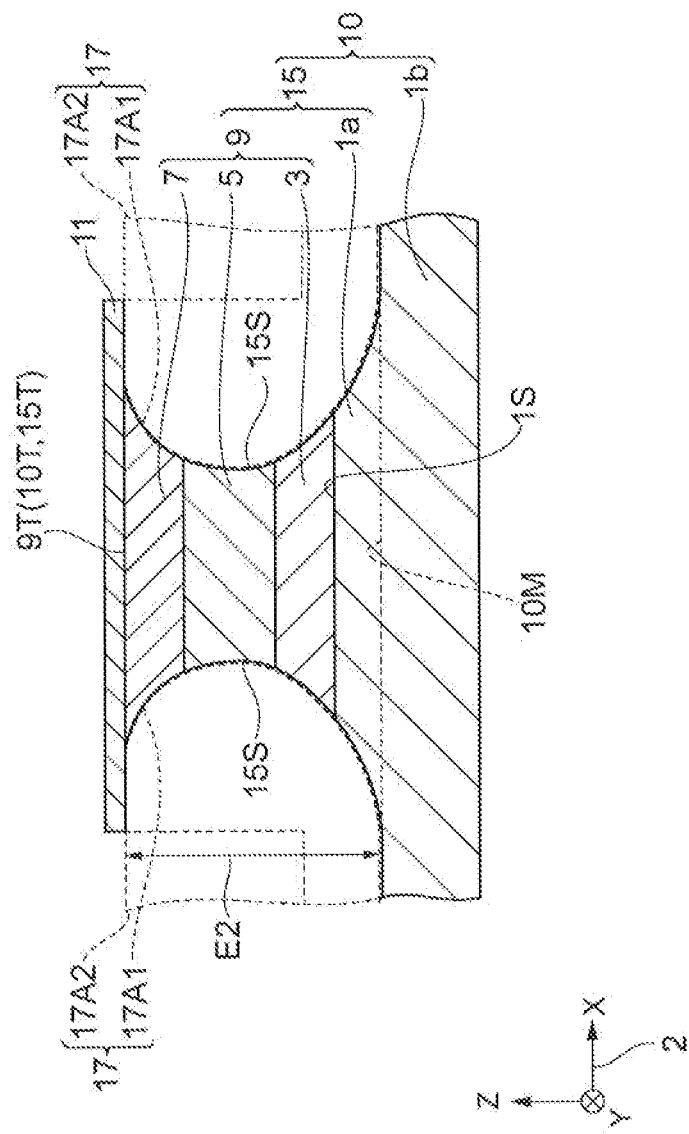
FIG. 4 is a cross sectional view for explaining a process for manufacturing buried hetero-structure laser diodes according to the first embodiment.

Subsequently, as illustrated in FIG. 4, the semiconductor structure 10 is further etched by a wet etching technique through the mask layer 11 to a midpoint TOM of the semiconductor structure 10 in the thickness direction, thereby forming a semiconductor mesa 15. The semiconductor mesa 15 includes a region of the semiconductor structure 10 that extends from the top surface 10T to the midpoint 10M. The top surface 9T of the stacked semiconductor layer 9 also serves as a top surface 15T of the semiconductor mesa 15.

In this embodiment, the midpoint 10M is at the middle of the semiconductor structure 10 in the thickness direction. Thus, the semiconductor mesa 15 is constituted by the contact layer 7, the upper cladding layer 5, the active layer 3 and an upper region 1a of the semiconductor substrate 1 that is above the midpoint 10M. The etching depth E2 from the top surface 10T to the midpoint 10M is, for example, 6 μm.

In a wet etching process, the semiconductor structure 10 is etched in the thickness direction and simultaneously in the X-axis direction. As a result, the semiconductor mesa 15 has an undercut shape relative to the mask layer 11 in the X-axis direction. That is, at least part of the semiconductor mesa 15 (in this embodiment, the entirety of the semiconductor mesa 15) has a shape in which the width in the X-axis direction is smaller than the width of the mask layer 11 in the X-axis direction. As a result, an overhang portion of the mask layer 11 is formed relative to the semiconductor mesa 15 in the X-axis direction. Further, the semiconductor mesa 15 extends along the Y-axis direction in conformity with the shape of the mask layer 11.

For example, the etching solution used in the wet etching process may be a solution obtained by mixing methanol having a liquid temperature of about 0° C. with approximately 1% by volume of bromine (Br), or a solution obtained by mixing hydrogen bromide (HBr), hydrogen peroxide ($H_2O_2$), water ($H_2O$) and hydrochloric acid (HCl), in a volume ratio of 20:2:20:20 in the order named.

A side surface 15S of the semiconductor mesa 15 is adjacent in the X-axis direction to an etched region 17 resulting from etching of the semiconductor structure 10 in this step. Immediately after completion of this step, the etched region 17 is forms a space region. The etched region 17 includes a first region 17A1 at an overhang part of the semiconductor mesa 15 and mask layer 11, and a second region 17A2. The first region 17A1 is adjacent to the side surface 15S of the semiconductor mesa 15 and covers the semiconductor substrate 1 (in this embodiment, a lower region 1b of the semiconductor substrate 1 that is below the midpoint 10M). The first region 17A1 is a region where a buried layer 19A is to be formed in a subsequent buried layer forming step (see FIG. 6). The second region 17A2 is a region of the etched region 17 except the first region 17A1.

The semiconductor structure 10 may be etched from the top surface 10T to the midpoint 10M directly by a wet etching technique alone.

(Buried Layer Forming Step)

Next, a buried layer forming step is carried out. In this step, a buried layer made of a semiconductor material is formed in the first region 17A1 alone while leaving the mask layer 11 on the semiconductor Mesa 15.

Figure 5:
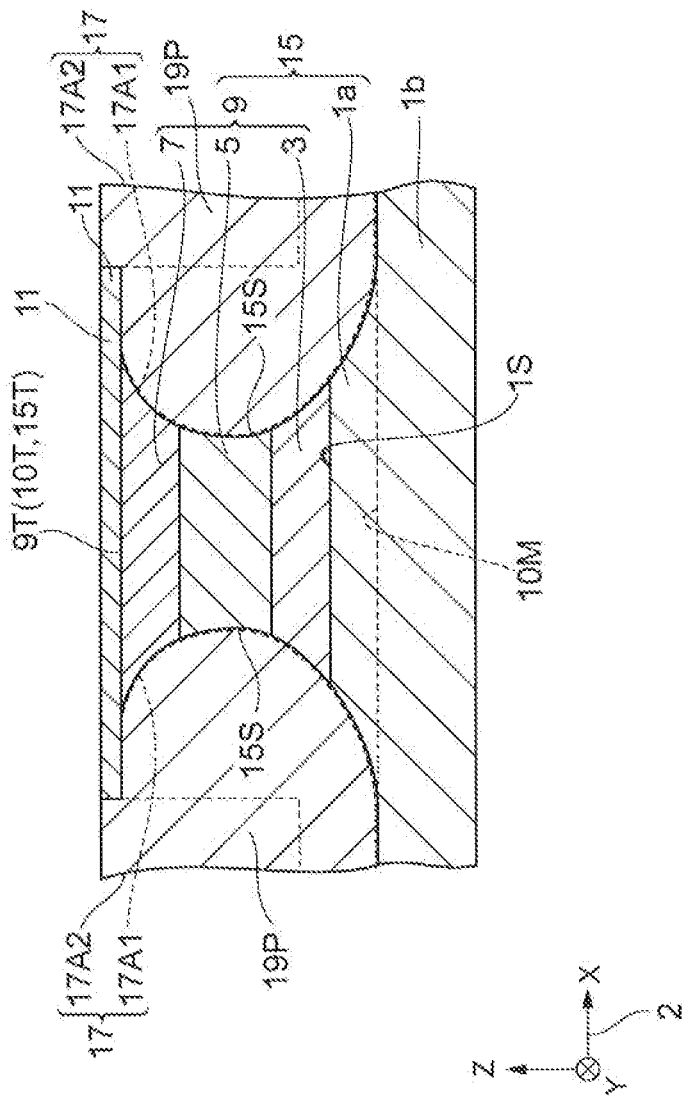
FIG. 5 is a cross, sectional view for explaining a process for manufacturing buried hetero-structure laser diodes according to the first embodiment.

In this embodiment, as illustrated in FIG. 5, a semiconductor layer (buried layer) 19P is grown in the first region 17A1 and the second region 17A2 (namely, in the entirety of the etched region 17) by, for example, a MOVPE method using the mask layer 11 as a selective growth mask (a semiconductor layer forming step). The semiconductor mesa 15 is buried with the semiconductor layer 19P. Because the semiconductor mesa 15 has the overhang portion of the mask layer 11 relative to the semiconductor mesa 15, the abnormal growth of the semiconductor layer 19P in the side surface 15S of the semiconductor mesa 15 is suppressed.

For example, the semiconductor layer 19P may be formed of a semi-insulating semiconductor material such as Fe-doped InP.

(Lateral Portion Forming Step)

Next, a lateral portion forming step is carried out. In this step, a lateral portion of the buried layer that is adjacent to the side surface 15S of the semiconductor mesa 15 is formed. As illustrated in FIG. 6, a portion of the semiconductor layer 19P that is present in the second region 17A2 is etched through the mask layer 11 by a method such as ICP-RIE using a gas mixture of methane gas ($CH_4$) and hydrogen gas ($H_2$) as an etching gas (a semiconductor layer etching step). That is, the semiconductor layer 19P is etched through the mask layer 11 to the midpoint of the semiconductor layer 19P in the thickness direction. The semiconductor mesa 15 has an undercut shape relative to the mask layer 11 in the X-axis direction. That is, the mask layer 11 has the overhang portion relative to the semiconductor mesa 15 in the X-axis direction. Thus, the portion of the semiconductor layer 19P that is present in the second region 17A2 can be etched selectively by adopting a dry etching process.

By the above dry etching, the semiconductor layer 19P is processed into a buried layer 19A. The buried layer 19A includes a lateral portion 19A1 and a bottom portion 19A2. The lateral portion 19A1 is a portion of the buried layer 19A that is adjacent to the entirety of the side surface 15S of the semiconductor mesa 15. The bottom portion 19A2 is a portion of the buried layer 19A that covers the semiconductor substrate 1 (in this embodiment, the lower region 1b of the semiconductor substrate 1 that is below the midpoint 10M). In this embodiment, a section of the lateral portion 19A1 of the buried layer 19A has a side surface 19A1V that extends along a direction perpendicular to the principal surface 1S of the semiconductor substrate 1 (along the X-axis direction). In this step, the lateral portion 19A1 is interposed between the second region 17A2 and the semiconductor mesa 15 in the X-axis direction.

Preferably, the second region 17A2 is adjacent to the side surface of the active layer 3, which is a portion of the side surface 15S of the semiconductor mesa 15, in the X-axis direction with the lateral portion 19A1 interposed therebetween. That is, etching of the semiconductor layer 19P is preferably carried out so as to create a space that is partially adjacent to the side surface of the active layer 3, which is a portion of the side surface 15S of the semiconductor mesa 15, in the X-axis direction with the lateral portion 19A1 interposed therebetween. With such a configuration, as will be described later, the distance between the side surface of the active layer 3 and an upper electrode 25 in the X-axis direction may be decreased, thereby achieving particularly high heat dissipation properties of the buried hetero-structure laser diodes (see FIG. 8).

In the above-described manner, the buried layer 19A made of a semiconductor material is formed in the first region 17A1 alone that is one part of the etched region 17.

(Passivation Film Forming Step)

Next, a passivation film forming step is carried out. In this step, first, the mask layer 11 is removed by, for example, a wet etching technique using an etching solution such as a hydrofluoric acid solution. Thereafter, as illustrated in FIG. 7, a passivation film 21 is formed on the exposed surface of the buried layer 19A. The passivation film 21 has an opening 21H which is formed on the top surface 15T of the semiconductor mesa 15 and extends along the Y-axis direction. The opening 21H may be formed on the entirety of the top surface 15T of the semiconductor mesa 15, or may be formed on part of the top surface 15T of the semiconductor mesa 15 while extending along the Y-axis direction. In the latter case, the passivation film 21 covers part of the top surface 15T of the semiconductor mesa 15.

The passivation film 21 is formed of a material that has a higher breakdown, voltage than the buried layer 19A. For example, the passivation film 21 may be, formed of an insulating material, such as silicon nitride (SiN) or silicon oxynitride (SiON). The thickness of the passivation film 21 is, for example, 300 nm.

In order to form such a passivation film 21, first, an insulating layer is formed on the entire surface of the semiconductor mesa 15 (the top surface 15T of the Semiconductor mesa 15) as well as on the entire surface of the buried layer 19A by, for example, a plasma-enhanced chemical vapor deposition (PECVD) method. Thereafter, an opening 21H is formed on the top surface 15T of the semiconductor mesa 15 by photolithography. Specifically; the opening 21H is formed by etching the insulating layer using a mask to expose the top surface 15T of the semiconductor mesa 15. The passivation film 21 is formed through these steps.

(Electrode Forming Step)

Next, an electrode forming step is carried out. In this step, as illustrated in FIG. 8, an upper electrode 25 is formed in the opening 21H by, for example, an evaporation method. The upper electrode 25 is in ohmic contact with the contact layer 7 through the opening 21H. In addition, the upper electrode 25 extends from the top surface 15T of the semiconductor mesa 15 to the second region 17A2 of the etched region 17. In this manner, the upper electrode 25 and the top surface 15T of the semiconductor mesa 15 are electrically connected to each other through the opening 21H. Furthermore, the upper electrode 25 is also formed on a side surface of the lateral portion 19A1 of the buried layer 19A through the passivation film 21. The passivation film 21 is interposed between the upper electrode 25 and the buried layer 19A.

Further, a lower electrode 27 is formed on the back surface 1B of the semiconductor substrate 1 by, for example, an evaporation method. As a result, the lower electrode 27 is electrically connected to the back surface 1B of the semiconductor substrate 1. Prior to the formation of the lower electrode 27, a step of polishing the back surface 1B of the semiconductor substrate 1 may be performed in order to reduce the thickness of the semiconductor substrate 1, thereby facilitating cleaving into laser diode (LD) chips. In such a case, the lower electrode 27 is formed on the back surface 1B of the semiconductor substrate 1 after the semiconductor substrate 1 is polished. A substrate product is obtained through the steps described hereinabove.

The upper electrode 25 and the lower electrode 27 are each made of a metal material. Thus, these electrodes exhibit a higher thermal conductivity than the buried layer 19A formed of a semiconductor material. For example, the upper electrode 25 is a Ti/Pt/Au stacked structure. The thickness of the upper electrode 25 is, for example, 500 nm. For example, the lower electrode 27 is a AuGeNi/Au stacked structure. The thickness of the lower electrode 27 is, for example, 1 μm.

The above substrate product is thereafter made into LD chips by, for example, cleaving. Thus, a buried hetero-structure laser diode 50A according to this embodiment may be obtained. When a voltage is applied between the upper electrode 25 and the lower electrode 27 in the buried hetero-structure laser diode 50A, a current does not flow into the buried layer IgA having a high resistivity. Thus, the flow of injected carriers can be confined to the semiconductor mesa 15. In the buried hetero-structure laser diode 50A according to this embodiment, the active layer 3 has a quantum cascade structure as described hereinabove. Thus, light is emitted by intersubband electron transition in a quantum well structure formed in each of the light emitting layers 3a. The light generated in the active layer 3 is propagated in the Y-axis direction so as to form a laser light. This laser light is emitted to outside from one end facet of the buried hetero-structure laser diode 50A in the Y-axis direction.

In the process for manufacturing buried hetero-structure laser diodes according to this embodiment, the upper electrode 25 is formed in the electrode forming step so as to extend from the top surface 15T of the semiconductor mesa 15 to the second region 17A2 of the etched region 17 (see. FIGS. 7 and 8). Accordingly, part of the upper electrode 25, which is formed of a material having a higher thermal conductivity than semiconductor materials, comes adjacent to the side surface 15S of the semiconductor mesa 15 in the second direction (the X-axis direction) with the lateral portion 19A1 of the buried layer 19A interposed therebetween.

Such a configuration makes it easy for heat that is generated in the active layer 3 of the semiconductor mesa 15 during laser oscillation to be dissipated in a direction toward the side surface 15S of the semiconductor mesa 15 (in the X-axis direction) as well, thereby improving heat dissipation properties. In the buried layer forming step, the buried layer 19A is formed in the one part (the first region 17A1) of the etched region 17 alone while leaving the mask layer 11 on the semiconductor mesa 15 (see FIGS. 3 to 6). Here, the mask layer 11 has remained after being used as a mask in etching of the semiconductor structure 10 in the semiconductor structure etching step. After the semiconductor structure etching step, the buried layer forming step is performed. The buried layer 19A has the lateral portion 19A1 adjacent to the side surface 15S of the semiconductor mesa 15, and the bottom portion 19A2 covering the semiconductor substrate 1.

Furthermore, the buried layer forming step and the lateral portion forming step are successively performed while leaving the mask layer 11 on the semiconductor mesa 15. After forming the lateral portion 19A1 of the buried layer 19A, the mask layer 11 on the semiconductor mesa 15 is removed. Therefore, the mask layer 11 is formed on the semiconductor mesa 15 under the process from the step of forming a semiconductor mesa (semiconductor structure etching step) to the step of forming a lateral portion of the buried layer (lateral portion forming step), and another mask layer is not formed on the semiconductor mesa 15 so as to for a the lateral portion of the buried layer. Unlike a case in which a new mask layer is formed on the semiconductor mesa 15 with a greater width than the semiconductor mesa 15 so as to form a trench, the process is free from the risk that the semiconductor mesa 15 and the mask layer 11 are misaligned, relative to each other. Thus, the thickness of the lateral portion 19A1 of the buried layer 19A in the X-axis direction can be controlled accurately. According to the above configuration, the thickness of the lateral portion 19A1 of the buried layer 19A in the X-axis direction can be prevented from becoming smaller than a desired thickness. Therefore, buried hetero-structure laser diodes having a higher breakdown voltage is obtained. In addition, the passivation film 21 is formed on the side surface of the lateral portion 19A1 of the buried layer 19A. The upper electrode 25 is formed on the passivation film 21 formed on the side surface of the lateral portion 19A1 of the buried layer 19A. The passivation film 21 is interposed between the upper electrode 25 and the buried layer 19A. Therefore, the breakdown voltage properties of buried hetero-structure laser diodes can be further enhanced.

According to the process in this embodiment described above, buried hetero-structure laser diodes can be manufactured which exhibit improved heat dissipation properties while maintaining a high breakdown voltage.

In the buried hetero-structure laser diode 50A according to this embodiment, the active layer 3 has a quantum cascade structure (see FIG. 1). A quantum cascade laser usually requires that a high current of about 0.5 A to 1 A be injected into an active layer in order to obtain a laser oscillation. Thus, a large amount of heat is generated in the active layer 3 during laser oscillation. According to the present invention, however, part of the upper electrode 25 is adjacent to the side surface 15S of the semiconductor mesa 15 in the second direction (the X-axis direction) with the lateral portion 19A1 of the buried layer 19A interposed therebetween (see FIG. 8), thus making it easy for heat generated in the active layer 3 of the semiconductor mesa 15 during laser oscillation to be dissipated in a direction toward the side surface 15S of the semiconductor mesa 15 (in the X-axis direction) as well. Thus, the heat dissipation properties of laser diodes are enhanced.

Second Embodiment

Next, a second embodiment of the processes for manufacturing buried hetero-structure laser diodes and the buried hetero-structure laser diodes will be described. The second and later embodiments will be mainly described focusing on the differences from the first embodiment.

Figure 9:
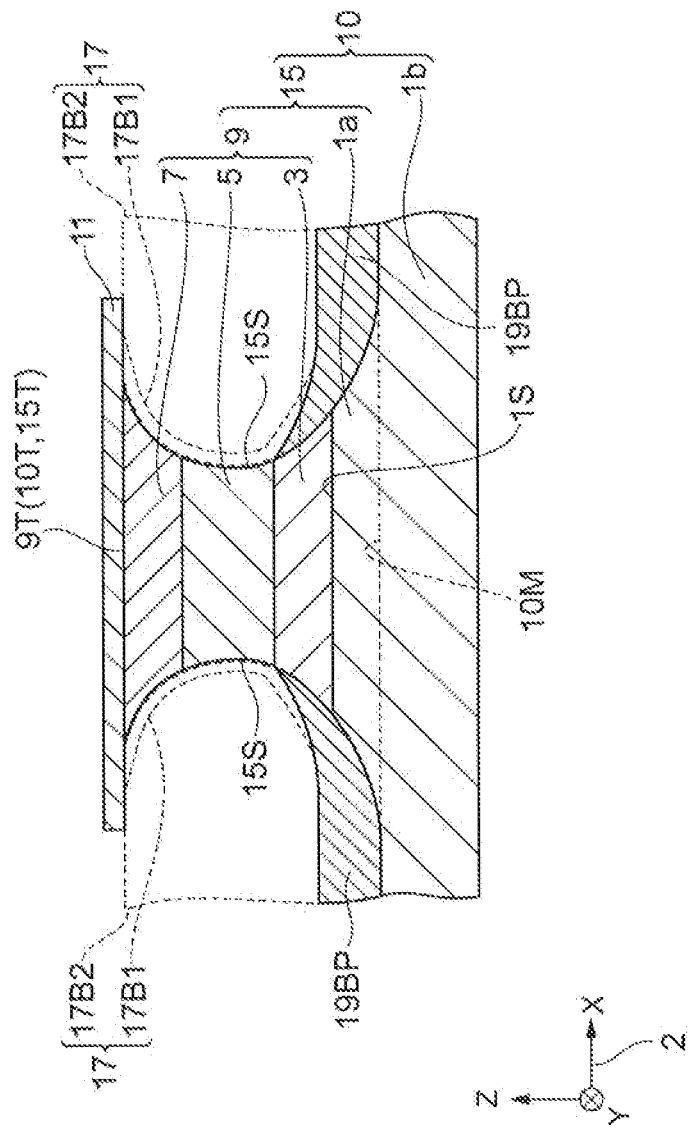
FIG. 9 is a cross sectional view for explaining a process for manufacturing buried hetero-structure laser diodes according to a second embodiment.
Figure 10:
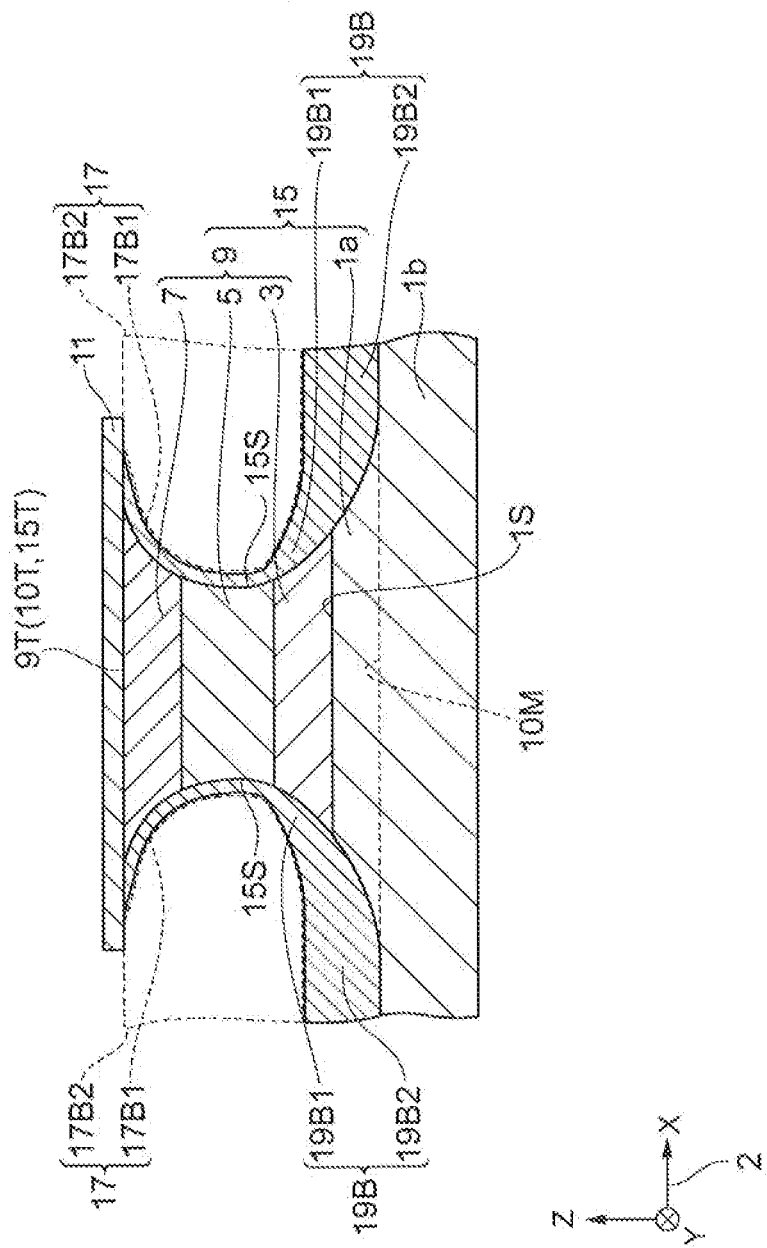
FIG. 10 is a cross sectional view for explaining a process for manufacturing buried hetero-structure laser diodes according to the second embodiment.
Figure 11:
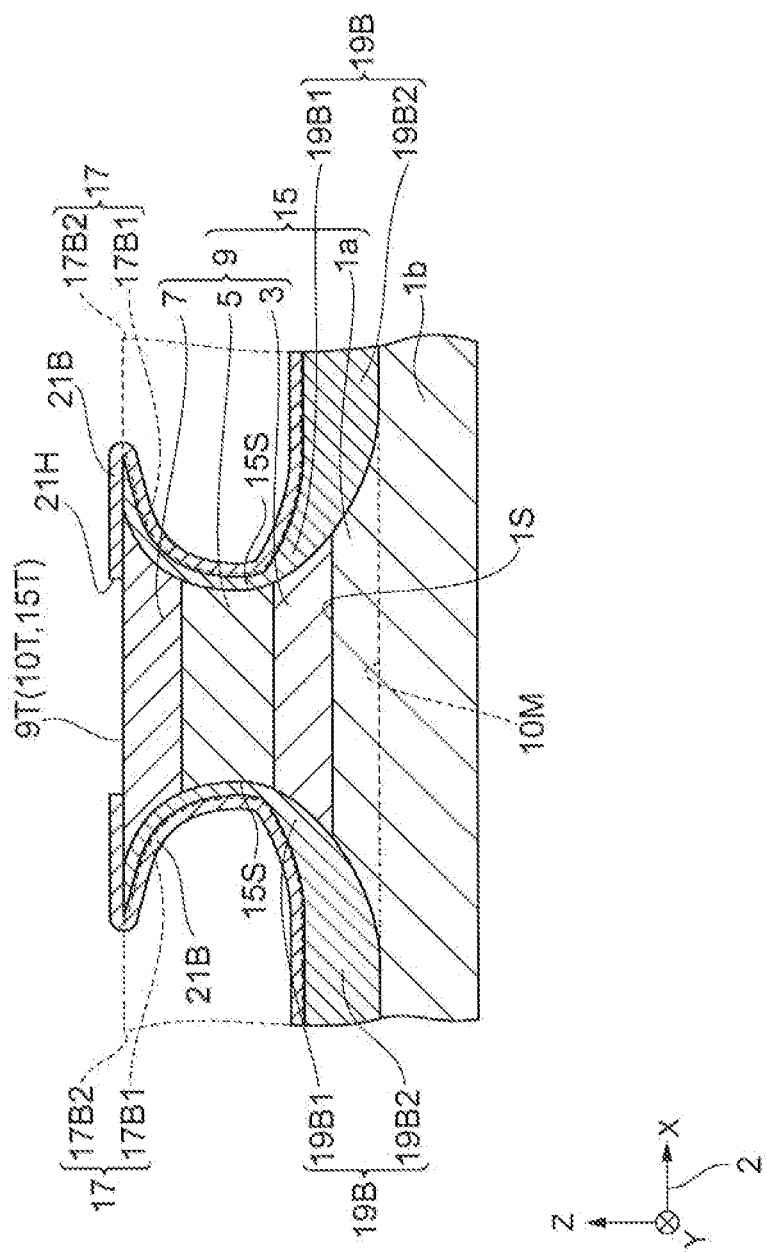
FIG. 11 is a cross sectional view for explaining a process for manufacturing buried hetero-structure laser diodes according to the second embodiment.
Figure 12:
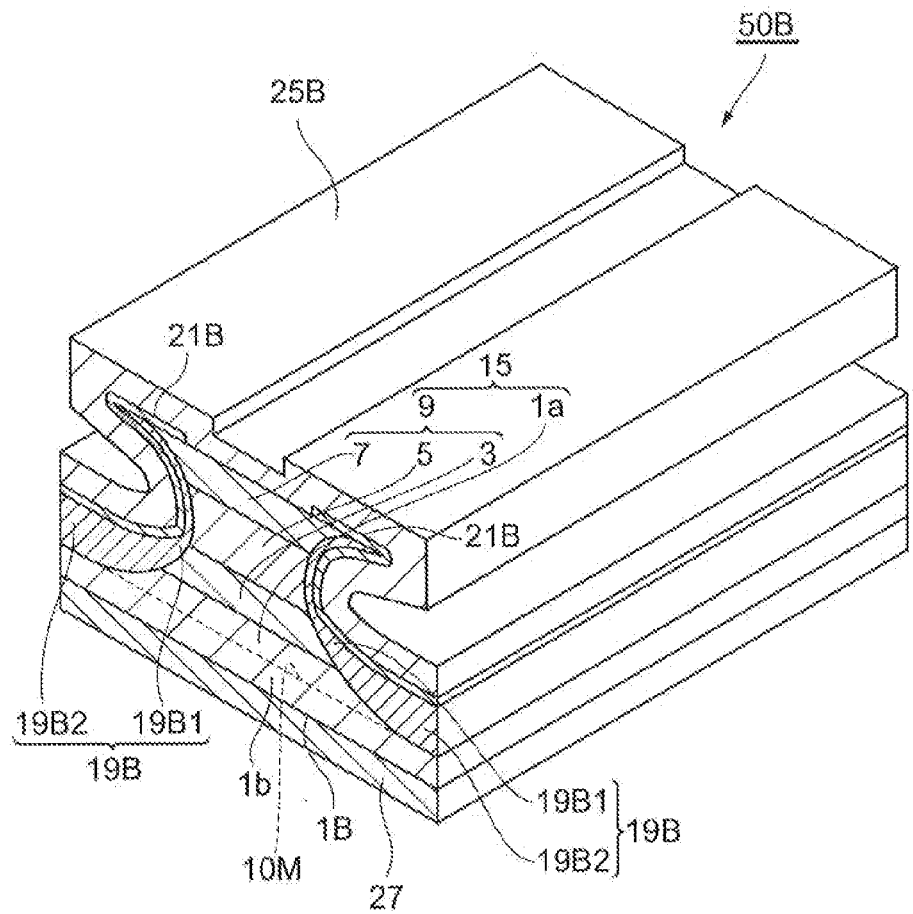
FIG. 12 is a perspective view for explaining a process for manufacturing buried hereto-structure laser diodes according to the second embodiment.

FIGS. 9 to 11 are cross sectional views for explaining a process for manufacturing buried hetero-structure laser diodes according to the second embodiment. FIG. 12 is a perspective view for explaining a process for manufacturing buried hetero-structure laser diodes according to the second embodiment.

The main difference between the second embodiment and the first embodiment is the contents of the buried layer forming step. In this embodiment, a stacked semiconductor layer forming step to a semiconductor structure etching step are the same as the stacked semiconductor layer forming step to the semiconductor structure etching step in the first embodiment.

As illustrated in FIG. 9, an etched region 17 in this embodiment includes a first region 17B1 that is one part of the etched region 17 and a second region 17B2 that is the other part of the etched region 17. Similarly to the first region 17A1 in the first embodiment (see FIG. 4); the first region 17B1 is adjacent to a side surface 15S of a semiconductor mesa 15 and covers a semiconductor substrate 1 (in this embodiment, a lower region 1b of the semiconductor substrate 1 that is below a midpoint 10M). The first region 17B1 is a region where a buried layer 19B is to be formed in a subsequent buried layer forming step (see. FIG. 10). The first region 17B1 has a different shape from that of the first region 17A1 in the first embodiment. The first region 17B1 has a shape that follows the contour of the side surface 15S of the semiconductor mesa 15. The second region 17B2 is a region of the etched region 17 except the first region 17B1.

(Buried Layer Forming Step)

In the buried layer forming step according to this embodiment, as illustrated in FIG. 9, a semiconductor layer 19BP is formed in a portion of the etched region 17 by, for example, MOVPE using a mask layer 11 as a selective growth mask. In the buried layer forming step, the semiconductor layer 19BP covers only part of the side surface 15S of the semiconductor mesa 15 (for example, a portion of the side, surface extending from a bottom surface of the semiconductor mesa 15 to a top surface of an active layer 3) as well as to cover the semiconductor substrate 1 (a semiconductor layer forming step). The semiconductor layer 19BP is made of a material similar to the material of the semiconductor layer 19P in the first embodiment (see FIG. 5).

Next, as illustrated in FIG. 10, mass transport of the semiconductor material forming the semiconductor layer 19BP is brought about. In the mass-transport process, the semiconductor material migrates onto the remaining part of the side surface 15S of the semiconductor mesa 15, thereby covering the entire side surface 15S of the semiconductor mesa 15 (a mass-transport step). In this step, the semiconductor material is migrated such that the surface free energy of the semiconductor layer 1913P becomes smaller. As a result, a portion of the semiconductor material covers the remaining part of the side surface 15S of the semiconductor mesa 15.

In the above manner, a buried layer 19B is obtained which includes a lateral portion 19B1 that is adjacent to the entire side surface 15S of the semiconductor mesa 15, and a bottom portion 19B2 that covers the semiconductor substrate 1 (in this embodiment, the lower region 1b of the semiconductor substrate 1 that is below the midpoint 10M).

The mass-transport of the semiconductor material forming the semiconductor layer 19BP may be brought about in the following manner. As an example, the semiconductor layer 19BP is formed of InP by MOVPE in the semiconductor layer forming step. In such a case, a gas such as phosphine or tertiarybutylphosphine (TBP) is fed into a growth furnace of the MOVPE apparatus to produce a phosphorus (P) atmosphere in the furnace, and the semiconductor layer 19BP is heat treated in the P atmosphere. This heat treatment brings about mass-transport Of the semiconductor material (in this example, InP) forming the semiconductor layer 19BP. The temperature in the heat treatment may be, for example, not less than 650° C. and not more than 700° C. The heat treatment temperature is more preferably not less than 680° C. and not more than 690° C.

After the mass-transport step, the lateral portion 19B1 is interposed between the second region 17B2 and the semiconductor mesa 15 in the X-axis direction.

(Passivation Film Forming Step)

Next, a passivation film forming step is carried out. In this step, after the mask layer 11 is removed, a passivation film 21B is formed as illustrated in FIG. 11. Similarly to the passivation film 21 in the first embodiment (see FIG. 7), the passivation film 21B covers the exposed surface of the buried layer 19B. Further, similarly to the passivation film 21 in the first embodiment, the passivation film 21B has an opening 21H which is formed on a top surface 15T of the semiconductor mesa 15 and extends along the Y-axis direction. The passivation film 21B in this embodiment also covers part of the top surface 15T of the semiconductor mesa 15. However, the passivation film 21B may not cover the top surface 15T. Further, the passivation film 21B in this embodiment has a shape that follows the contour of the buried layer 19B. Thus, the shape of the passivation film 21B is different from the shape of the passivation film 21 in the first embodiment.

(Electrode Forming Step)

Next, an electrode forming step is carried out. In this step, an upper electrode 25B is formed so as to extend from the top surface 15T of the semiconductor mesa 15 to the second region 17B2 of the etched region 17 as illustrated in FIG. 12. In this step, a method similar to the method in the electrode forming step in the first embodiment may be used. In this manner, the upper electrode 25B and the top, surface 15T of the semiconductor mesa 15 are electrically connected to each other through the opening 21H. Further, a lower electrode 27 is formed on a back surface 1B of the semiconductor substrate 1. A substrate product is obtained through the steps described hereinabove. The upper electrode 25B is formed of a material similar to the material of the upper electrode 25 in the first embodiment (see FIG. 8). Of the upper electrode 25B, a portion present in the second region 17B2 has a shape that follows the contour of the side surface 15S of the semiconductor mesa 15. Thus, the shape of the upper electrode 25B is different from the shape of the upper electrode 25 in the first embodiment.

The above substrate product is thereafter made into LD chips by, for example, cleaving. Thus, a buried hetero-structure laser diode 50B according to this embodiment may be obtained.

The buried hetero-structure laser diode 50B manufactured by the process according to this embodiment exhibits improved heat dissipation properties while maintaining a high breakdown voltage. The reasons why the buried hetero-structure laser diode achieves such effects are the same as those described in the first embodiment.

In the process for manufacturing buried hetero-structure laser diodes according to this embodiment, the buried layer forming step includes the semiconductor layer forming step and the mass-transport step (see FIGS. 9 to 11). In the semiconductor layer forming step, the semiconductor layer 19BP is formed in a portion of the etched region 17 so as to cover only part of the side surface 15S of the semiconductor mesa 15 and the semiconductor substrate 1. In the mass-transport step, mass-transport of the semiconductor material forming the semiconductor layer 19BP is brought about. As a result, the semiconductor material migrates onto the remaining part of the side surface 15S of the semiconductor mesa 15, thereby forming the buried layer 19B.

Unlike the first embodiment of the processes for manufacturing buried hetero, structure laser diodes, it is not necessary in the second embodiment that the buried layer (semiconductor layer) etching step be carried out. Thus, the production steps are simplified. Further, the buried layer 19B can be prevented from damages caused by etching of the semiconductor layer.

According to the buried hetero-structure laser diode 50B of this embodiment, heat generated in the active layer 3 of the semiconductor mesa 15 during laser oscillation can be easily dissipated in a direction toward the side surface 15S of the semiconductor mesa 15 (in the X-axis direction) as well. Thus, the heat dissipation properties of the laser diode are enhanced (see FIGS. 8 and 12). The reasons why the buried hetero-structure laser diode 50B achieves such effects are the same as those for the buried hetero-structure laser diode 50A according to the first embodiment.

Third Embodiment

Next, a third embodiment of the processes for manufacturing buried hetero-structure laser diodes and the buried hetero-Structure laser diodes will be described.

Figure 13:
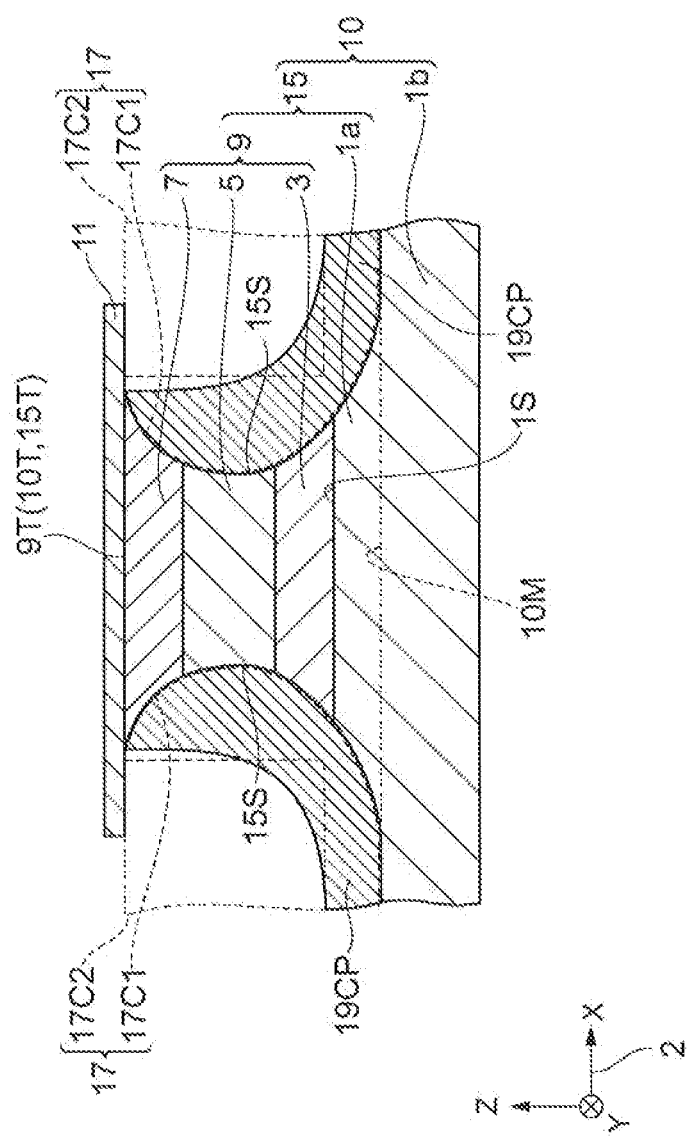
FIG. 13 is across sectional view for explaining a process for manufacturing buried hetero-structure laser diodes according to a third embodiment.
Figure 14:
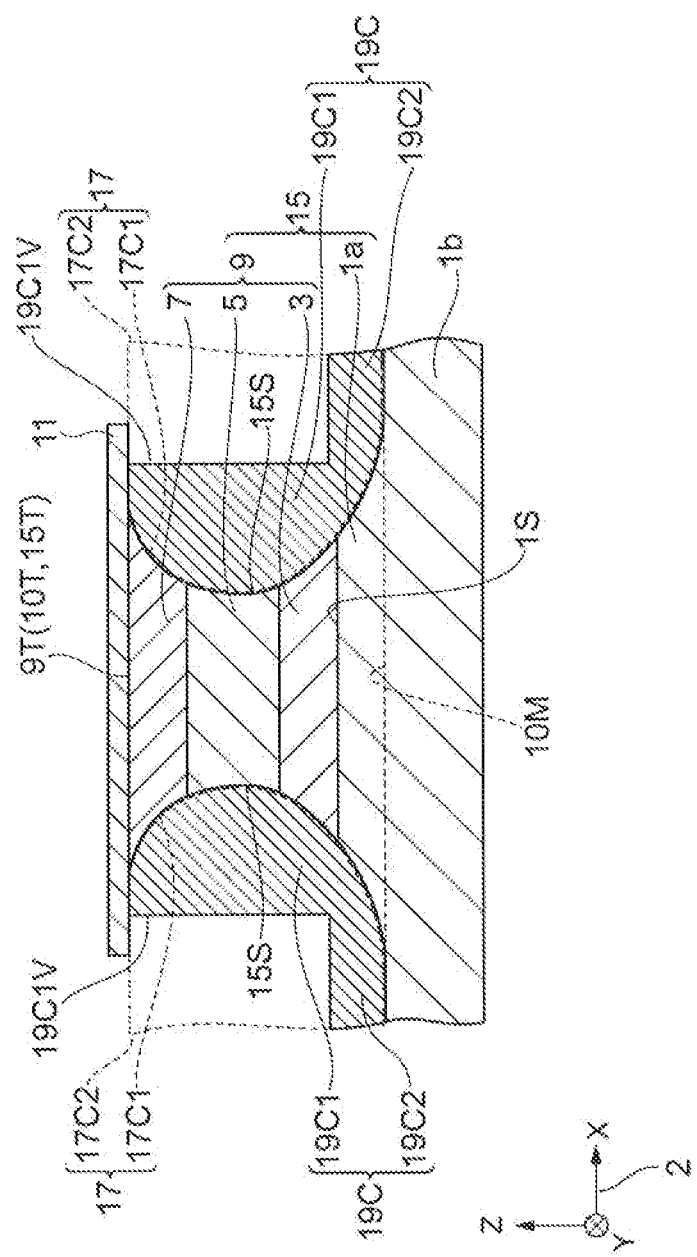
FIG. 14 is a cross sectional view for explaining a process for manufacturing buried hetero-structure laser diodes according to the third embodiment.
Figure 15:
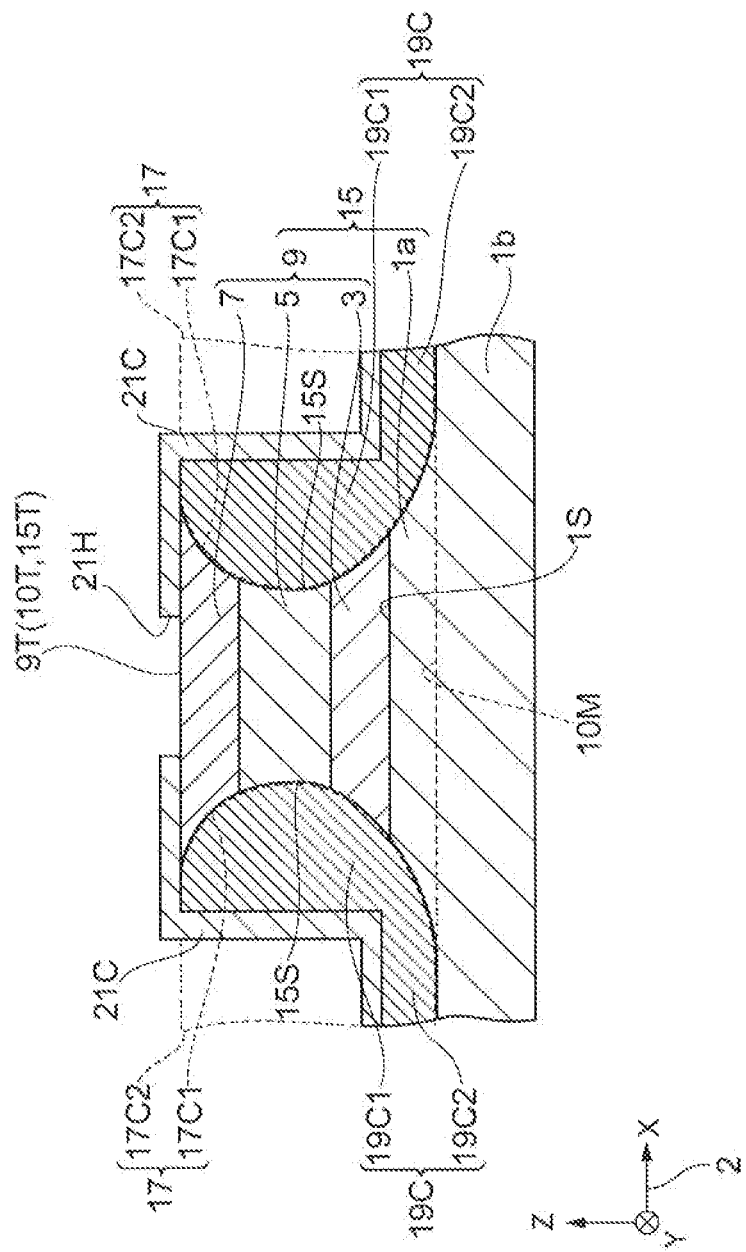
FIG. 15 is a cross sectional view for explaining a process for manufacturing buried hetero-structure laser diodes according to the third embodiment.
Figure 16:
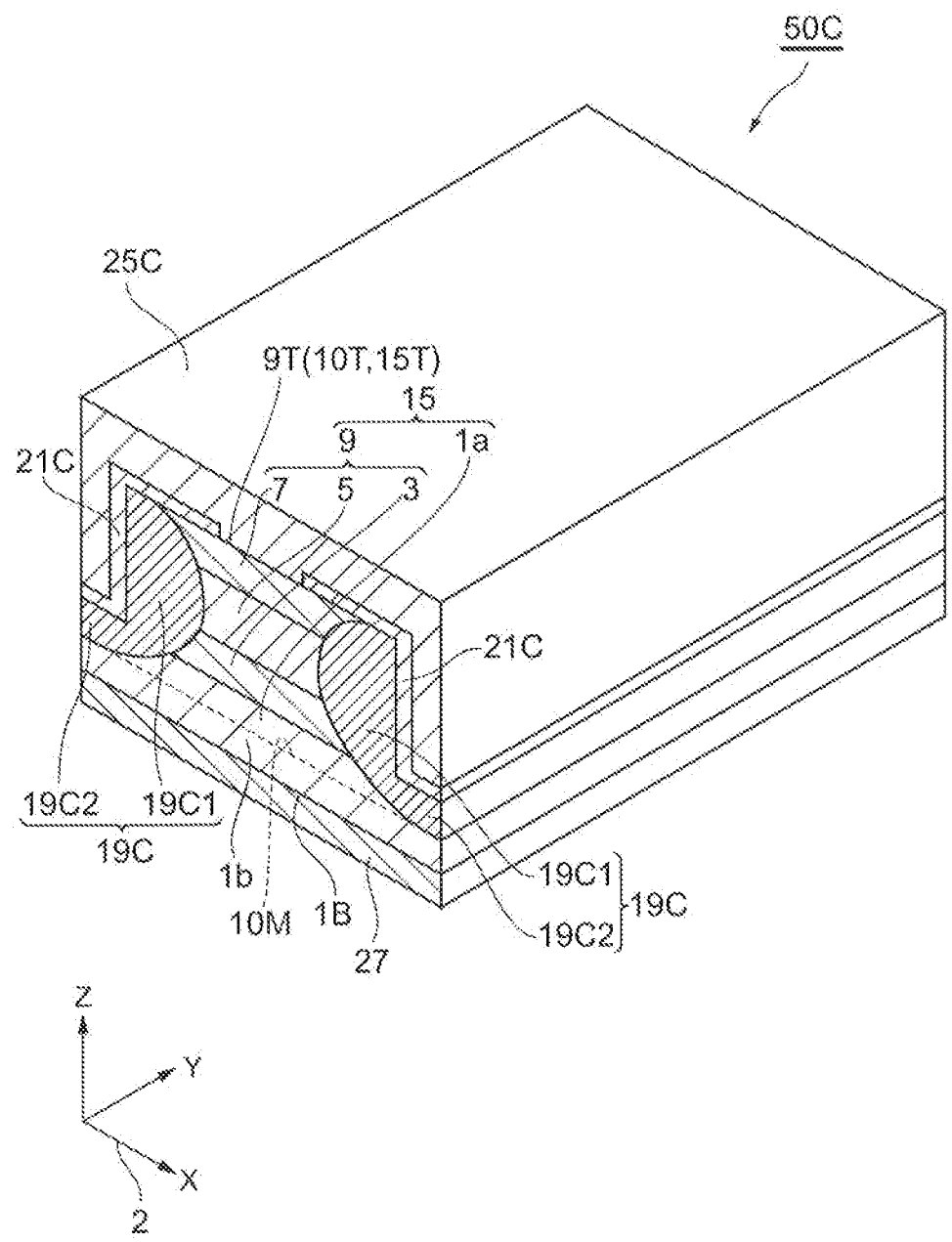
FIG. 16 is a perspective view for explaining a process for manufacturing buried hetero-structure laser diodes according to the third embodiment.

FIGS. 13 to 15 are cross sectional views for explaining a process for manufacturing buried hetero-structure laser diodes according to the third embodiment. FIG. 16 is a perspective view for explaining a process for manufacturing bulled hetero-structure laser diodes according to the third embodiment.

The main difference between the third embodiment and the first embodiment is the contents of the buried layer forming step. In this embodiment, a principal surface 1S of a semiconductor substrate 1 is a (100) plane. Further, the first direction is a [011] direction of the semiconductor substrate 1. Thus, in the mask layer forming step, a mask layer 11 is formed on a stacked semiconductor layer 9 so as to extend along the [011] direction of the semiconductor substrate 1.

As illustrated in FIG. 13, an etched region 17 in this embodiment includes a first region 17C1 and a second region 17C2. The first region 17C1 is one part of the etched region 17 and the second region 17C2 is the other part of the etched region 17. Similarly to the first region 17A1 in the first embodiment (see FIG. 4), the first region 17C1 is adjacent to a side surface 15S of a semiconductor mesa 15 and covers the semiconductor substrate 1 (in this embodiment, a lower region 1b of the semiconductor substrate 1 that is below a midpoint 10M). The first region 17C1 is a region where a buried layer 19C is to be formed in a subsequent buried layer forming step (see FIG. 14). The second region 17C2 is a region of the etched region 17 except the first region 17C1.

(Buried Layer Forming Step)

In the buried layer forming step according to this embodiment, as illustrated in FIG. 13, a semiconductor layer 19CP is formed in a portion of the etched region 17 by, for example, MOVPE using the mask layer 11 as a selective growth mask. As a result, the semiconductor layer 19CP covers the side surface 15S of the semiconductor mesa 15 and the semiconductor substrate 1 (a semiconductor layer forming step). The semiconductor layer 19CP is made of a material similar to the material of the semiconductor layer 19P in the first embodiment (see FIG. 5).

Next, as illustrated in FIG. 14, mass-transport of the semiconductor material forming the semiconductor layer 19CP is brought about (a mass-transport step). In this step, the semiconductor material is migrated such that the surface free energy of the semiconductor layer 19CP becomes smaller. In this embodiment, the principal surface 1S of the semiconductor substrate 1 is set to be a (100) plane. In this case, the semiconductor material is caused to migrate so as to form a (01-1) plane and a (0-11) plane. As a result, the semiconductor layer 19CP is deformed such that a (01-1) plane and a (0-11) plane are formed.

In the above manner, a buried layer 19C is obtained. The buried layer 19C, includes a lateral portion 19C1 and a bottom portion 19C2. The lateral portion 19C1 is adjacent to the entire side surface 15S of the semiconductor mesa 15, and the bottom portion 19C2 covers the semiconductor substrate 1. In this embodiment, the region that is covered by the bottom portion 19C2 of the buried layer 19C is the lower region 1b of the semiconductor substrate 1 that is below the midpoint 10M. At least a section of the lateral portion 19C1 of the buried layer 19C has a side surface 19C1V that is a (0-11) plane and is perpendicular to the principal surface 1S of the semiconductor substrate 1.

The mass-transport of the semiconductor material forming the semiconductor layer 19CP may be brought about in the same manner as the mass-transport of the semiconductor material forming the semiconductor layer 19BP is caused to occur in the second embodiment.

After the mass-transport step, the lateral portion 19C1 is interposed between the second region 17C2 and the semiconductor mesa 15 in the X-axis direction.

(Passivation Film Forming Step)

Next, a passivation film forming step is carried out. In this step, after the mask layer 11 is removed, a passivation film 21C is formed as illustrated in FIG. 15. Similarly to the passivation film 21 in the first embodiment (see FIG. 7), the passivation film 21C covers the exposed surface of the buried layer 19C. Further, similarly to the passivation film 21 in the first embodiment, the passivation film 21C has an opening 21H which is formed on a top surface 15T of the semiconductor mesa 15 and extends along the Y-axis direction. The passivation film 21C in this embodiment also covers part of the top surface 15T of the semiconductor mesa 15. However, the passivation film 21C may not cover the top surface 15T.

(Electrode Forming Step)

Next, an electrode forming step is carried out. In this step, an upper electrode 25C is formed so as to extend from the top surface 15T of the semiconductor mesa 15 to the second region 17C2 of the etched region 17 as illustrated in FIG. 16. In this step, a method similar to the method in the electrode forming step in the first embodiment may be used. In this manner, the upper electrode 25C and the top surface 15T of the semiconductor mesa 15 are electrically connected to each other through the opening 21H. Further, a lower electrode 27 is formed on a back surface 1B of the semiconductor substrate 1. A substrate product is obtained through the steps described hereinabove. The upper electrode 25C is formed of a material similar to the material of the upper electrode 25 in the first embodiment (set FIG. 8).

The above substrate product is thereafter made into LD chips by, for example, cleaving. Thus, a buried hetero-structure laser diode 50C according to this embodiment may be obtained.

The buried hetero-structure laser diode 50C manufactured by the process according to this embodiment exhibits improved heat dissipation properties while maintaining a high breakdown voltage. The reasons why the buried hetero-structure laser diode achieves such effects are the same as those described in the first embodiment.

In the process for manufacturing buried hetero-structure laser diodes according to this embodiment, the principal surface 1S of the semiconductor substrate 1 is a (100) plane, and the first direction is a [011] direction of the semiconductor substrate 1. Further, the buried layer forming step includes the semiconductor layer forming step and the mass-transport step. In the semiconductor layer forming step, the semiconductor layer 19CP is formed in a portion of the etched region 17 so as to cover the side surface 15S of the semiconductor mesa 15 and the semiconductor substrate 1. In the mass-transport step, mass-transport of the semiconductor material forming the semiconductor layer 19CP is brought about so as to cause a change in the shape of the semiconductor layer 19CP, thereby forming the buried layer 19C. Specifically, the semiconductor material is caused to migrate so as to form a (01-1) plane and a (0-11) plane. As a result, the semiconductor layer 19CP is deformed such that a (01-1) plane and a (0-11) place are formed. After the mass-transport step, at least a section of the lateral portion 19C1 of the buried layer 19C has the side surface 19C1V that is a (0-11) plane (see FIGS. 13 and 14).

Thus, the at least a section of the lateral portion 19C1 of the buried layer 19C formed in the mass-transport step extends in a direction perpendicular to the principal surface 1S of the semiconductor substrate 1. With this configuration, the upper electrode 25 can be easily formed in the electrode forming step so as to extend from the top surface 15T of the semiconductor mesa 15 to the second region 17C2 of the etched region 17 (see. FIGS. 15 and 16).

According to the buried hetero-structure laser diode 50C of this embodiment, heat generated in the active layer 3 of the semiconductor mesa 15 during laser oscillation can be easily dissipated in a direction toward the side surface 15S of the semiconductor mesa 15 (in the X-axis direction) as well. Thus, the heat dissipation properties of the laser diode are enhanced (see FIGS. 8 and 16). The reasons why the buried hetero-structure laser diode 50C achieves such effects are the same as those for the buried hetero-structure laser diode 50A according to the first embodiment.

Fourth Embodiment

Next, a fourth embodiment of the processes for manufacturing buried hetero-structure laser diodes and the buried hetero-structure laser diodes will be described.

Figure 17:
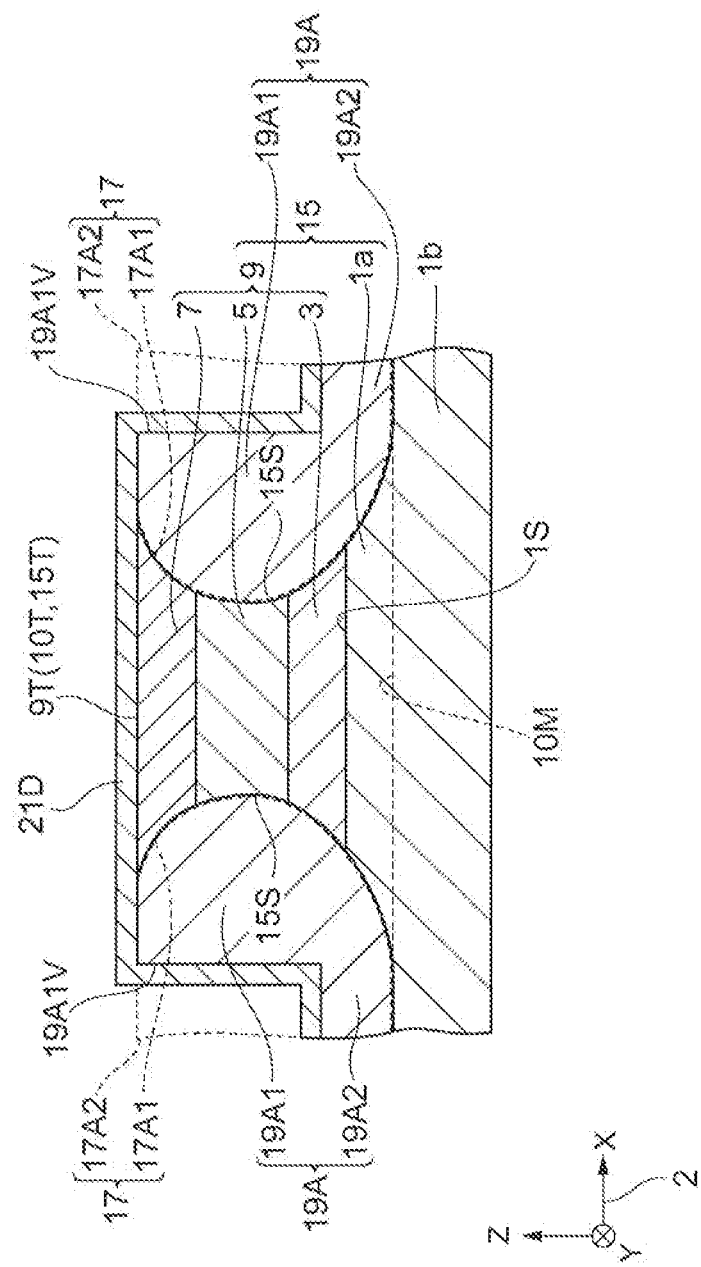
FIG. 17 is a cross sectional view for explaining a process for manufacturing buried hetero-structure laser diodes according to a fourth embodiment.
Figure 18:
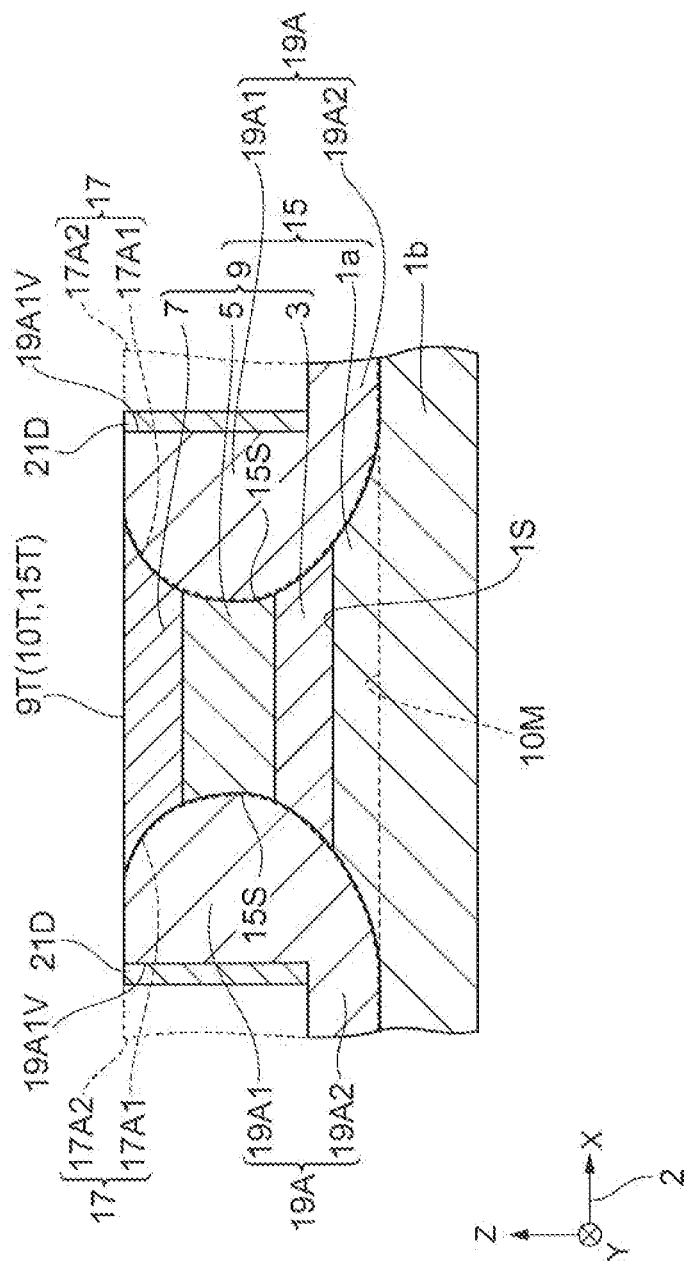
FIG. 18 is a cross sectional view for explaining a process for manufacturing buried hetero-structure laser diodes according to the fourth embodiment.
Figure 19:
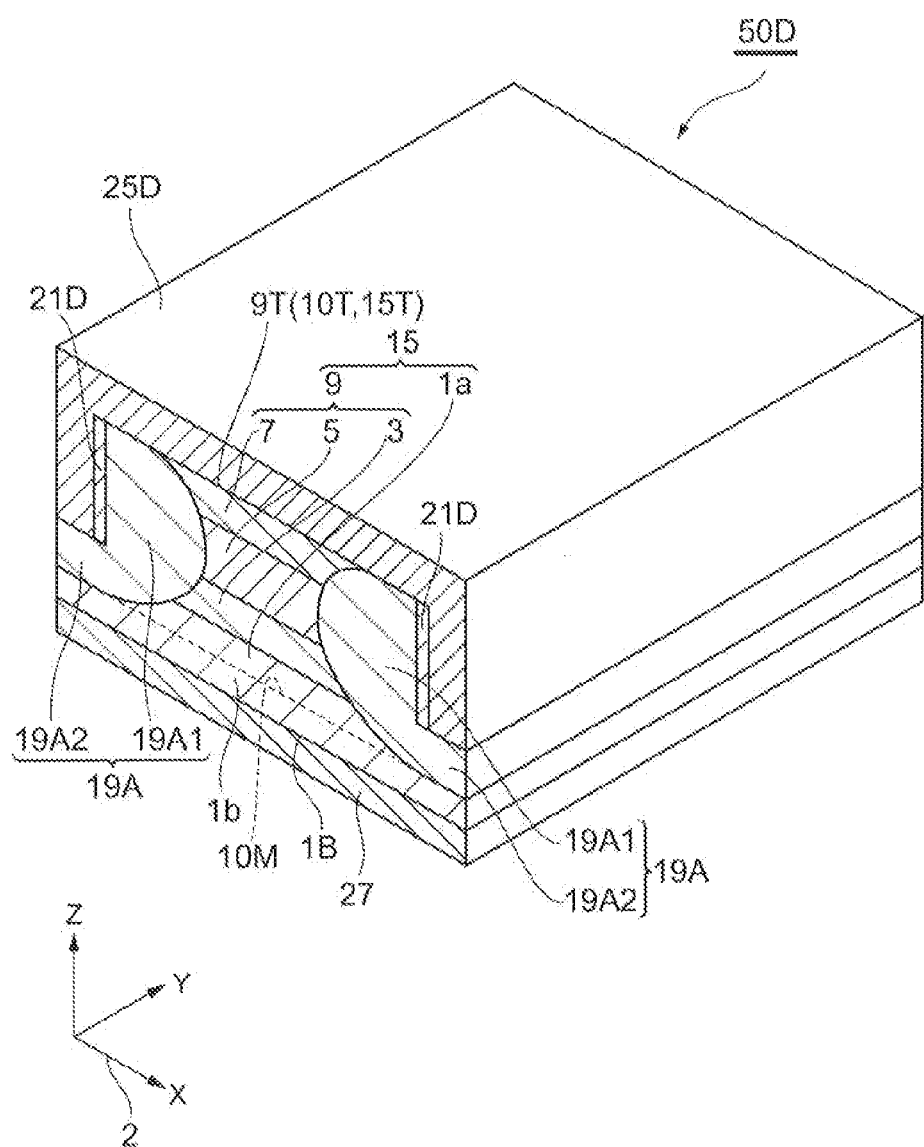
FIG. 19 is a perspective view for explaining a process for manufacturing buried hetero-structure laser diodes according to the fourth embodiment.

FIGS. 17 and 18 are cross sectional views for explaining a process for manufacturing buried hetero-structure laser diodes according to the fourth embodiment. FIG. 19 is a perspective view for explaining a process for manufacturing buried hetero-structure laser diodes according to the fourth embodiment.

The main difference between the fourth embodiment and the first embodiment is the contents of the passivation film forming step. In this embodiment, a stacked semiconductor layer forming step to a buried layer forming step are the same as the stacked semiconductor layer forming step to the buried layer forming step in the first embodiment.

(Passivation Film Forming Step)

In the passivation film forming step in this embodiment, after a mask layer 11 is removed, a passivation film 21D is formed on a top surface 15T of a semiconductor mesa 15 and an exposed surface of a buried layer 19A as illustrated in FIG. 17. The passivation film 21D may be formed of the same material and by the same method as those for forming the passivation film 21 in the first embodiment.

Next, as illustrated in FIG. 18, the passivation film 21D is etched by a dry etching process except on a side surface 19A1V of a lateral portion 19A1. In this dry etching process, a mask covering on the passivation film 21D formed on the side surface 19A1V of the lateral portion 19A1 of the buried layer 19A is not formed. After forming the passivation film 21D, the dry etching process is successively performed without forming a mask on the passivation film 21D formed on the side surface 19A1V of the lateral portion 19A1. The side surface 19A1V of the lateral portion 19A1 extends in a direction perpendicular to a principal surface 1S of a semiconductor substrate 1. Thus, it is difficult for the passivation film 21D formed on the side surface 19A1V to be removed by a dry etching process. As a result, the other portion of the passivation film 21D can be removed while the portion of the passivation film 21D on the side surface 19A1V of the lateral portion 19A1 remains without being etched. Then, the top surface 15T of the semiconductor mesa 15 is exposed.

(Electrode Forming Step)

Next, an electrode forming step is carried out. In this step, an upper electrode 25D is formed by the same method as described in the electrode forming step in the first embodiment so as to extend from the top surface 15T of the semiconductor, mesa 15 to a Second region 17A2 of an etched region 17 as illustrated in FIG. 19. In this manner, the upper electrode 25D and the top surface 15T of the semiconductor mesa 15 are electrically connected to each other. Further, a lower electrode 27 is formed on a back surface 1B of the semiconductor substrate 1. A substrate product is obtained through the steps described hereinabove. The upper electrode 25D is formed of a material similar to the material of the upper electrode 25 in the first embodiment (see FIG. 8).

The above substrate product is thereafter made into LD chips by, for example, cleaving. Thus, a buried hetero-structure laser diode 50D according to this embodiment may be obtained.

The buried hetero-structure laser diode 50D manufactured by the process according to this embodiment exhibits improved heat dissipation properties while maintaining a high breakdown voltage. The reasons why the buried hetero-structure laser diode achieves such effects are the same as those described in the first embodiment.

In the process for manufacturing buried hetero-structure laser diodes according to this embodiment, at least a section of the lateral portion 19A1 of the buried layer 19A has the side surface 19A1V which extends in a direction perpendicular to the principal surface 1S of the semiconductor substrate 1. Further, the passivation film forming step includes a step of forming the passivation film 21D on the top surface 15T of the semiconductor mesa 15 and the exposed surface of the buried layer 19A, and a step of etching the passivation film 21D by a dry etching process except on the at least a section (the side surface 19A1V) of the lateral portion 19A1 of the buried layer 19A (see FIGS. 17 and 18).

As a result of the passivation film forming step performed as described above, the passivation film 21D remains on the at least a section (the side surface 19A1V) of the lateral portion 19A1 of the buried layer 19A, whereby the breakdown voltage properties of the buried hetero-structure laser diode 50D are enhanced to a sufficient level. In this embodiment, the passivation film 21D is formed on the top surface 15T of the semiconductor mesa 15 and the exposed surface of the buried layer 19A and is thereafter etched by a dry etching process such that the portion of the passivation film 21D formed on the at least a section (the side surface 19A1V) of the lateral portion 19A1 of the buried layer 19A remains and the other portion is removed. This configuration suppresses heat generated in the active layer 3 during laser oscillation from being hardly dissipated due to the presence of the passivation film 21D. Furthermore, in the dry etching process so as to expose the top surface 15T of the semiconductor mesa 15 (the step of forming the opening on the top surface 15T of the semiconductor mesa 15), a step of forming a mask covering the passivation film 21D formed on the side surface 19A1V of the lateral portion 19A1 of the buried layer 19A can be omitted. Thus, the production steps are simplified.

According to the buried hetero-structure laser diode 50D of this embodiment, heat generated in active layer 3 of the semiconductor mesa 15 during laser oscillation can be easily dissipated in a direction toward the side surface 15S of the semiconductor mesa 15 (in the X-axis direction) as well. Thus, the heat dissipation properties oldie laser diode are enhanced (see FIGS. 8 and 19). The reasons why the buried hetero-structure, laser diode 50D achieves such effects are the same as those for the buried hetero-structure laser diode. 50A according to the first embodiment.

The present invention is not limited to the embodiments described hereinabove, and various modifications are possible.

In the first to the fourth embodiments, the midpoint 10M is located at a position in the semiconductor substrate 1 that corresponds to the midpoint of the semiconductor structure 10 in the thickness direction. That is, the semiconductor mesa 15 is constituted by the region of the semiconductor structure 10 that extends from the top surface 10T to the midpoint in the thickness direction that is located in the semiconductor substrate 1 (see. FIG. 4). However, the midpoint 10M may be located in the interface between the stacked semiconductor layer 9 and the semiconductor substrate 1, or at a position in the stacked semiconductor layer 9 that corresponds to the midpoint of the semiconductor structure 10 in the thickness direction.

However, the midpoint 10M is preferably located below the top surface of the active layer 3 toward the back surface 1B of the semiconductor substrate 1 in order to make sure that the distance in the X-axis direction between the active layer 3 and the upper electrode 25 (the upper electrode 25B, the upper electrode 25C or the upper electrode 25D) is small and heat dissipation properties are enhanced as a result. Further, the midpoint 10M is preferably located below the lower surface of the active layer 3 toward the back surface 1B of the semiconductor substrate 1 (see FIGS. 4, 8, 12, 16 and 19).

In the first to the fourth embodiments, the stacked semiconductor layer 9 has a structure for forming a quantum cascade laser (see FIG. 1). However, the stacked semiconductor layer 9 may have a structure for forming another type of laser, for example a semiconductor laser having an emission wavelength in the mid-infrared wavelength region (a 2 μm to 10 μm wavelength band) such as AlGaAsSb/InGaAsSb quantum well laser formed on a GaSb substrate or InAsSb/InAlAsSb quantum well laser formed on a GaSb substrate (Type II quantum well laser):

In the first to the fourth embodiments, the process involves a step of forming the passivation film 21 (the passivation film 21B, the passivation film 21C or the passivation film 21D) (see FIGS. 7, 11, 15, 17 and 18). However, the passivation film forming step may be omitted.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A process for manufacturing buried hetero-structure laser diodes, said process comprising the steps of:
   forming a stacked semiconductor layer including an active layer on a principal surface of a substrate;
   forming a stripe-shaped mask layer on the stacked semiconductor layer, the mask layer extending along a first direction;
   forming a semiconductor mesa extending along the first direction by dry etching the stacked semiconductor layer through the stripe-shaped mask layer;
   after forming the semiconductor mesa, selectively wet etching the stacked semiconductor layer of the semiconductor mesa through the stripe-shaped mask layer to form an overhang of the semiconductor mesa under the mask layer and a space region under the overhang;
   selectively growing a buried layer in the space region on a side surface of the semiconductor mesa and on the substrate while leaving the mask layer on the semiconductor mesa, the buried layer having a first side surface adjacent to the side surface of the semiconductor mesa in a second direction perpendicular to the first direction;
   forming a lateral portion of the buried layer and a bottom portion of the buried layer that covers the substrate by etching the buried layer to the middle thereof by using the stripe-shaped mask layer on the semiconductor mesa to form a second side surface of the buried layer in the second direction;
   after forming the lateral portion of the buried layer, removing the mask layer on the semiconductor mesa; and
   forming an electrode on a top surface of the semiconductor mesa, the side surface of the lateral portion of the buried layer, and on the bottom portion of the buried layer so that the electrode is formed on the buried layer with the buried layer between the electrode and the substrate.

2. The process for manufacturing buried hetero-structure laser diodes according to claim 1, wherein the process further comprises:
   a step of forming a passivation film on the top surface of the semiconductor mesa and the second side surface of the buried layer, and
   a step of forming an opening on the top surface of the semiconductor mesa, and
   wherein, in the step of forming the electrode, the electrode is formed in the opening and on the passivation film formed on the second side surface of the buried layer.

3. The process for manufacturing buried hetero-structure laser diodes according to claim 2, wherein the second side surface of the buried layer has a surface that extends along a direction perpendicular to the principal surface of the semiconductor substrate, and
   wherein, in the step of forming the opening on the top surface of the semiconductor mesa, the passivation film is etched by a dry etching without forming a mask on the passivation film formed on the second side surface of the buried layer, the passivation film on the second side surface remaining.

4. The process for manufacturing buried hetero-structure laser diodes according to claim 1, wherein the buried layer is made of Fe-doped InP.

5. The process for manufacturing buried hetero-structure laser diodes according to claim 1, wherein the active layer of the stacked semiconductor layer includes a quantum cascade structure having a plurality of light emitting layers and a plurality of injection layers alternately stacked on top of one another.

* * * * *